United States Patent
Minegishi et al.

(10) Patent No.: US 10,398,037 B2
(45) Date of Patent: Aug. 27, 2019

(54) PRINTED CIRCUIT BOARD AND ELECTRONIC DEVICE

(71) Applicant: CANON KABUSHIKI KAISHA, Tokyo (JP)

(72) Inventors: Kunihiko Minegishi, Yokohama (JP); Mitsutoshi Hasegawa, Yokohama (JP); Takashi Sakaki, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/897,560

(22) Filed: Feb. 15, 2018

(65) Prior Publication Data

US 2018/0242462 A1  Aug. 23, 2018

(30) Foreign Application Priority Data

Feb. 20, 2017  (JP) .................................. 2017-029031
Feb. 21, 2017  (JP) .................................. 2017-029822

(51) Int. Cl.
*H05K 7/10*   (2006.01)
*H05K 7/12*   (2006.01)
(Continued)

(52) U.S. Cl.
CPC ........... *H05K 3/3421* (2013.01); *H05K 1/111* (2013.01); *H05K 1/181* (2013.01); *H05K 3/3436* (2013.01); *H05K 2201/0989* (2013.01); *H05K 2201/09372* (2013.01); *H05K 2201/10674* (2013.01); *H05K 2201/10719* (2013.01);
(Continued)

(58) Field of Classification Search
CPC ................... H05K 1/111; H05K 1/181; H05K 2201/09372; H05K 2201/0989; H05K 2201/10674; H05K 2201/10719; H05K 2201/10734; H05K 2201/10977; H05K 2203/1305; H05K 3/3421; H05K 3/3436
See application file for complete search history.

(56) References Cited

U.S. PATENT DOCUMENTS 5,912,531 A * 6/1999 Hasegawa ............. H01J 31/127
                                                              313/309
2009/0173424 A1* 7/2009 Hasegawa ............ B23K 1/0016
                                                              156/60
(Continued)

FOREIGN PATENT DOCUMENTS

JP        2002-283098 A    10/2002

*Primary Examiner* — Yuriy Semenenko
(74) *Attorney, Agent, or Firm* — Venable LLP

(57) ABSTRACT

An electronic component is mounted on the mounting face of a printed wiring board and a plurality of terminals arranged on the mounting face of the printed wiring board are respectively bonded to a plurality of terminals arranged on the bottom surface of the electronic component by means of solder. Solder paste containing powdery solder and thermosetting resin is provided to the plurality of terminals on the mounting face, then the electronic component is mounted on the mounting face of the printed wiring board, and subsequently the solder paste is heated to bond the corresponding terminals by means of molten solder. Thereafter, the molten solder is allowed to solidify and the thermosetting resin separated from the solder paste is allowed to cure in a state where it is held in contact with metal members arranged separately relative to the terminals.

23 Claims, 12 Drawing Sheets

(51) Int. Cl.
*H05K 3/34* (2006.01)
*H05K 1/11* (2006.01)
*H05K 1/18* (2006.01)

(52) U.S. Cl.
CPC .............. *H05K 2201/10734* (2013.01); *H05K 2201/10977* (2013.01); *H05K 2203/1305* (2013.01)

(56) References Cited

U.S. PATENT DOCUMENTS

| | | | | |
|---|---|---|---|---|
| 2010/0116534 | A1* | 5/2010 | Choi | H01L 21/563 174/260 |
| 2011/0061803 | A1* | 3/2011 | Hasegawa | H01J 5/24 156/272.2 |
| 2013/0134606 | A1* | 5/2013 | Im | H01L 23/367 257/778 |
| 2015/0255383 | A1* | 9/2015 | Kataoka | H01L 23/49838 361/760 |
| 2018/0092211 | A1 | 3/2018 | Minegishi | |

* cited by examiner

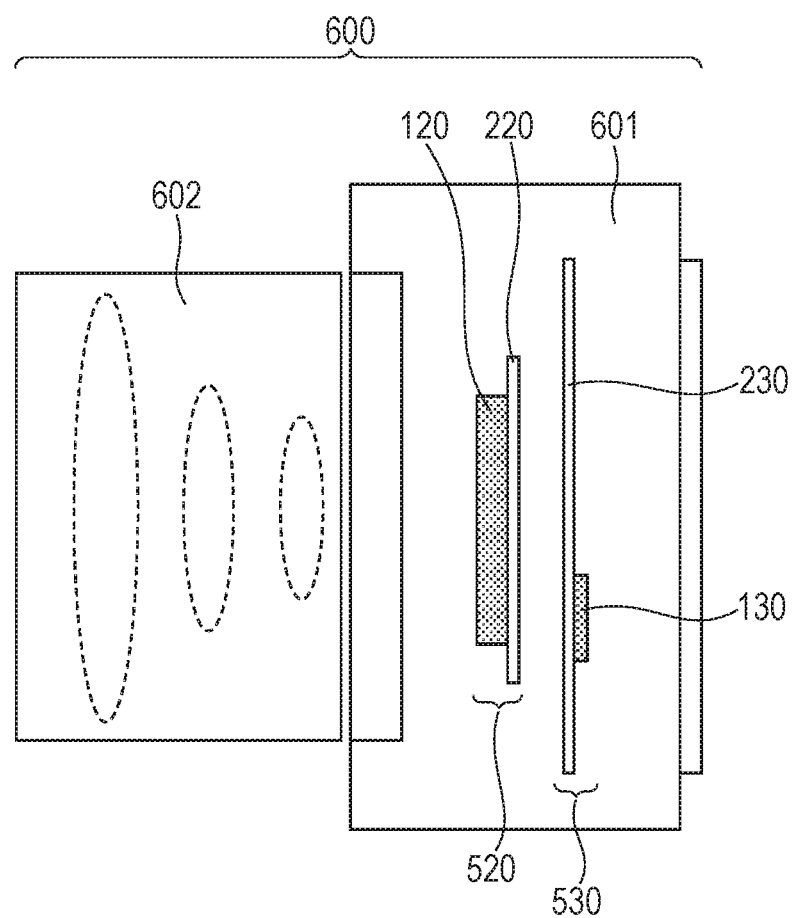

PRINTED CIRCUIT BOARD AND ELECTRONIC DEVICE

BACKGROUND OF THE INVENTION

Field of the Invention

The present invention relates to a method of manufacturing a printed circuit board, a printed circuit board and an electronic device.

Description of the Related Art

With the trend toward downsized higher-performance electronic devices in recent years, electronic devices to be mounted on printed circuit boards, which are in turn to be used in electronic devices, are also required to be downsized and show higher performance. For this reason, packages such as BGA (ball grid array) packages, LGA (land grid array) packages and so on that are adapted to be downsized and increase the number of terminals are popularly being employed in electronic components to be used in electronic devices such as mobile telecommunication devices and digital cameras. BGA packages and LGA packages are structurally so designed that electrodes can be fitted to the bottom surface of the package to eliminate the use of lead terminals and hence they can be downsized with ease. Additionally, when electrodes are arranged at a small pitch on the bottom surface of such a package, the number of signal terminals and power terminals etc. can be increased without upsizing the package. Then, such packages will become ready to achieve higher performance.

However, to increase the number of electrode terminals of such a package, which may be a BGA package or an LGA package, the solder joints between the package and a printed circuit board need to be miniaturized. Then, as the solder joints are miniaturized, the mechanical strength thereof can become a problem. More specifically, electric disconnection can arise in the solder joints when the electronic device having such a package is inadvertently dropped or otherwise subjected to a shock. Additionally, as electronic components are required to achieve higher performance, they inevitably generate more heat than ever in operation and can become remarkably deformed due to thermal expansion. Then, again, disconnection can occur in the solder joints due to such thermal deformation.

To suppress the possible disconnection in the solder joints between the package, or the electronic component in general, and the printed circuit board, there are instances where a technique of reinforcing the solder joints by means of an underfill material is used. However, reinforcement by means of an underfill material is accompanied by a problem of requiring a step of filling the gap between the electronic component and the printed circuit board with an underfill material after bonding them and another step of heating and curing the underfill material, which steps consequently raise the manufacturing cost. Therefore, along with the trend toward downsized higher-performance electronic components, there is a demand for electronic devices that can secure the joint reliability of solder joints connecting printed circuit boards and packages without raising the manufacturing cost.

In response to the demand, Japanese Patent Application Laid-Open No. 2002-283098 discloses a thermosetting resin-containing solder paste obtained by mixing powdery solder and thermosetting epoxy resin and a method of bonding an electronic component and a printed circuit board by means of the solder paste. In a reflow soldering step conducted by using the solder paste at a temperature not lower than the melting point of solder, the solder in the solder paste containing the thermosetting resin is separated from the thermosetting resin and the thermosetting resin existing around the solder joint is cured and bonded to the solder joints. Thus, the thermosetting resin operates as reinforcement resin. A solder bonding operation and an operation of reinforcing the solder joints can be executed simultaneously in the reflow soldering step by using the thermosetting resin-containing solder paste. Then, the reinforcement resin filling step and the curing step as described above for the use of an underfill material are no longer required and both the reliability of solder bonding and low manufacturing cost can be secured.

FIG. 8 of the accompanying drawings schematically illustrates the structure in cross section of a printed circuit board that is manufactured by using the above-described thermosetting resin-containing solder paste. In the printed circuit board 500 shown in FIG. 8, an electronic component 100 is mounted on the mounting face of a printed wiring board 200. A plurality of lands 101 are arranged on the bottom surface of the electronic component 100 and a plurality of lands 202 that respectively correspond to the plurality of lands 101 are arranged on the mounting face of the printed circuit board 200. The plurality of lands 101 are respectively bonded to the corresponding plurality of lands 202 by way of so many solder joints 302. A structure where each of the solder joints 302 is surrounded by solid reinforcement resin (cured thermosetting resin) 401 to reinforce the solder joint 302 is formed there. Note that the mounting face of the printed wiring board 200 is covered by solder resist 201 except the sites where the lands 101 are arranged and the reinforcement resin 401 is made to adhere to the solder resist 201.

When forming a structure as shown in FIG. 8 and the thermosetting resin cures before the solder melts, solder bonding is hindered to give rise to a bonding failure. Therefore resin that shows a low reaction rate is employed for the thermosetting resin so that the resin may start curing after the solder melts and bonds the lands 101 to the respective lands 202. As thermosetting resin showing a low reaction rate is employed, the solder melts in the reflow soldering step and the thermosetting resin starts curing after the lands (terminals) of the electronic component are bonded to the respective lands of the printed wiring board so that the hindrance of solder bonding is suppressed. Note, however, that the thermosetting resin needs to be heated so as to make it satisfactorily cure after the completion of the solder bonding operation in order to cause the thermosetting resin to operate as reinforcement resin of the solder joints of the printed circuit board.

Then, to cause the resin showing a low reaction rate to satisfactorily cure, either the reflow temperature needs to be held high or, after the completion of solder bonding, the heating temperature needs to be lowered to solidify the solder and subsequently the resin needs to be heated at relatively low temperature for a long time. However, keeping high reflow temperature is not recommendable because, if the electronic component and the printed wiring board are exposed to high temperature for a long time, the quality of the manufactured printed circuit board can be degraded by the thermal damage attributable to the exposure to high temperature. Additionally, since the thermosetting resin cures in a state where remarkable thermal deformation has occurred to the electronic component and the substrate, the finished printed circuit board can also be deformed to a large extent. Particularly, when the electronic component is an imaging device that carries at least a CCD (charge coupled device) or a CMOS (complementary metal oxide semiconductor) sensor, the optical performance of the imaging device will be degraded if the device is deformed to a large extent by heat. Then, in a printed circuit board having an imaging device mounted thereon, the resin needs to be cured in a state where any thermal deformation is suppressed. On the other hand, with the technique of curing the resin by lowering the heating temperature after the completion of solder bonding and subsequently heating the resin at relatively low temperature for a long time, a long cycle time is required to manufacture printed circuit boards to give rise to a problem of largely eliminating the manufacturing cost reduction effect of using thermosetting resin-containing solder.

In short, there is a strong demand for a method of manufacturing a printed circuit board at low cost, with which thermosetting resin can be cured at low temperature within a short period time in the step of mounting an electronic component on a printed wiring board by means of thermosetting resin-containing solder paste so as to make the printed circuit board show a high bonding reliability and to be practically free from thermal deformation. There is also a strong demand for printed circuit boards manufactured by such a method and for electronic devices comprising such a printed circuit board.

SUMMARY OF THE INVENTION

In the first aspect of the present invention, there is provided a method of manufacturing a printed circuit board involving mounting an electronic component on the mounting face of a printed wiring board carrying solder resist arranged thereon and bonding a plurality of first lands arranged on the bottom surface of the electronic component respectively to a plurality of second lands arranged on the mounting face of the printed wiring board so as to correspond to the plurality of first lands by means of solder, the method comprising: a providing step of providing solder paste containing powdery solder and thermosetting resin to the plurality of second lands; a mounting step of mounting the electronic component on the mounting face of the printed wiring board; a solder bonding step of melting the powdery solder by heating the solder paste to a temperature higher than the melting point of the powdery solder and respectively bonding the plurality of first lands to the corresponding plurality of second lands; and a resin curing/heating step of curing the thermosetting resin separated from the solder paste; at least one metal member being arranged around each at least one of the plurality of second lands; the total area of the metal members in the mounting region of the mounting face for mounting the electronic component thereon being not greater than the area of the solder resist; the thermosetting resin curing in a state of being held in contact with the solder and the metal members.

In the printed circuit board in the first aspect of the present invention, an electronic component is mounted on mounting face carrying solder resist arranged thereon of a printed wiring board and a plurality of first lands are arranged on the bottom surface of the electronic component, while a plurality of second lands are arranged on the mounting face of the printed wiring board so as to correspond to the plurality of first lands and the plurality of first lands are respectively bonded to the plurality of corresponding second lands by means of solder, at least one metal member being arranged around at least one of the plurality of second lands, the total area of the at least one metal member being not greater than the area of the solder resist in a region mounting the electronic component of the mounting face, a thermosetting resin being held in contact with the solder and the metal member.

In the second aspect of the present invention, there is provided a printed circuit board comprising a printed wiring board having a mounting face carrying solder resist arranged thereon and an electronic component arranged on the mounting face of the printed wiring board, a plurality of first lands being arranged on the bottom surface of the electronic component, a plurality of second lands being arranged respectively in apertures of the solder resist arranged on the mounting face of the printed wiring board so as to correspond to the plurality of first lands, the plurality of first lands and the plurality of corresponding second lands being respectively bonded to each other by means of solder to produce so many solder joints, the solder joints being reinforced by reinforcement resin; the printed circuit board having a metal member arranged around each at least one of the second lands on the mounting face of the printed wiring board within a distance from the center of the second land so as not to contact the second land, the distance being defined by $\sqrt{\{(R_1^2+R_1R_2+R_2^2)/3(W_s/100)\}}$, where $R_1$ is a radius of the second land; $R_2$ is a radius of the first land bonded to the second land; $W_s$ is a volume fraction as represented by vol % of the solder joint relative to the sum of the volume of the solder joint and the volume of the reinforcement resin.

In the first aspect of the present invention, there is provided an electronic device comprising a printed circuit board including a printed wiring board and an electronic component, the electronic component being mounted on the mounting face of the printed wiring board, a plurality of first lands being arranged on the bottom surface of the electronic component, a plurality of second lands being mounted on the mounting face of the printed wiring board so as to correspond to the plurality of first lands, the plurality of first lands and the corresponding plurality of second lands being respectively bonded to each other by means of solder; a plurality of metal members being arranged around at least one of the plurality of second lands; solder resist being further arranged on the mounting face; the total area of the metal members in the mounting region of the mounting face for mounting the electronic component being not greater than the area of the solder resist, the thermosetting resin curing in a state of being held in contact with the solder and the metal members.

Further features of the present invention will become apparent from the following description of exemplary embodiments with reference to the attached drawings.

BRIEF DESCRIPTION OF THE DRAWINGS

FIG. 5 is a schematic illustration of the configuration of the fifth embodiment of electronic device of the present invention provided in the first aspect of the present invention, which is a digital camera.

DESCRIPTION OF THE EMBODIMENTS

Now, embodiments of the present invention will be described in detail by referring to the accompanying drawings.

(A) First Aspect

Firstly, embodiments in the first aspect of the present invention will be described below.

First Embodiment

FIGS. 1A through 1D are schematic cross-sectional views of the first embodiment of printed circuit board 500 provided in the first aspect of the present invention, illustrating different manufacturing steps of the method of manufacturing the printed circuit board 500.

Figure 1A:
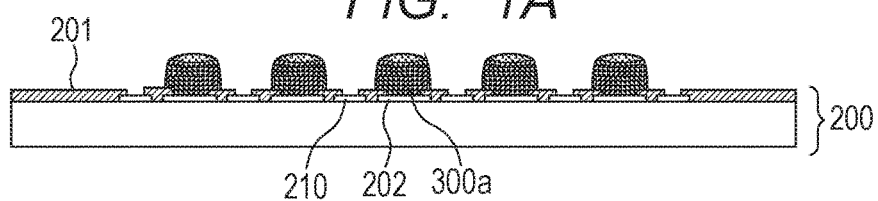
FIGS. 1A, 1B, 1C and 1D are schematic cross-sectional views of the first embodiment of printed circuit board provided in the first aspect of the present invention, illustrating different manufacturing steps of the method of manufacturing the printed circuit board including the finished printed circuit board.

FIG. 1A schematically illustrates the providing step of providing solder paste 300a that contains thermosetting resin onto a plurality of lands (second lands) 202 formed on the mounting face of a printed wiring board 200. The thermosetting resin-containing solder paste 300a is solder paste containing at least powdery solder and thermosetting resin, although it may additionally contain as an ingredient thereof flux that is required for soldering operations. Thermosetting resin-containing solder paste 300a can be supplied by means of screen printing or a dispenser just like ordinary solder.

As shown in FIG. 1A, at least one or more than one metal member 210 are arranged around each of the lands 202. The metal members 210 shown in FIG. 1A are practically lands (third lands) arranged on the printed wiring board 200 just like the lands 202.

Figure 1B:
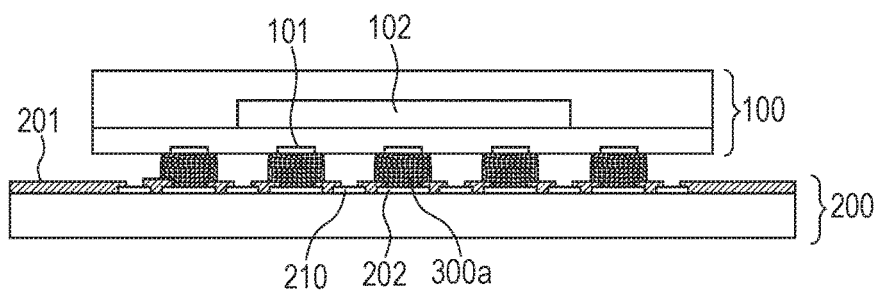

FIG. 1B schematically illustrates the mounting step of mounting an LGA type electronic component 100 by means of a mounter onto the printed wiring board 200 to which the thermosetting resin-containing solder paste 300a has been provided. A semiconductor element 102 is mounted in the electronic component 100 and a plurality of lands 101 (first lands) are arranged on the bottom surface of the electronic component 100. At this time, actually, the electronic component 100 is mounted such that the plurality of lands 101 thereof are respectively aligned with the corresponding plurality of lands 202 of the printed wiring board so as to be bonded to the plurality of lands 202.

Figure 1C:
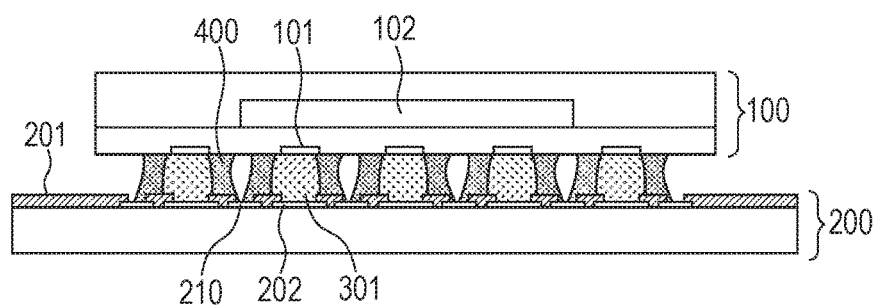

FIG. 1C schematically illustrates the solder bonding step of melting the supplied thermosetting resin-containing solder paste 300a and respectively bonding the first lands 101 and the second lands 202. The solder bonding step can be conducted in a reflow furnace. In the solder bonding step, the thermosetting resin-containing solder paste 300a melts and the molten solder 301 is separated from the thermosetting resin 400 so that the molten solder bonds the lands 101 of the electronic component 100 to the respective lands 202 of the printed wiring board 200. Subsequently, the thermosetting resin 400 that has been separated from the solder paste spreads on the bottom surface of the electronic component 100 and also on the surface of solder resist 201 formed on the printed wiring board 200 so as to be brought into contact with the metal members 210 formed on the printed wiring board 200.

Figure 1D:
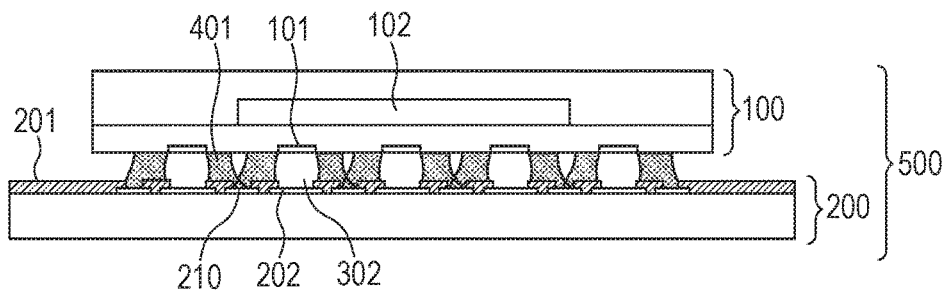

FIG. 1D schematically illustrates the resin curing/heating step of curing the thermosetting resin 400 after the completion of the soldier bonding (the solidification of the solder). The thermal damage and the thermal deformation that can occur to the printed wiring board 200 and the electronic component 100 can be suppressed by conducting the resin curing/heating step at a temperature lower than the temperature of the solder bonding step. The resin curing/heating step may be conducted in the reflow furnace in which the solder bonding step has been conducted so that the heating operation in the solder bonding step may be continued in the coming resin curing/heating step. When the reflow furnace is dimensionally small and an enough time cannot be secured for the resin curing/heating step, the resin curing/heating step may be conducted in a separate heating furnace after the reflow soldering operation (the solder bonding step).

The metal members 210 operate as catalyst in the curing reaction of the thermosetting resin 400 to accelerate the curing of the thermosetting resin 400 and hence they can reduce the curing time of the thermosetting resin 400. Additionally, the metal members 210 show a thermal conductivity that is higher than the thermal conductivity of the solder resist 201 that contains resin as principal ingredient so that the temperature of the resin that is held in contact with the metal members 210 rises quickly in a heating operation. This effect also reduces the curing time of the thermosetting resin 400.

The metal members 210 may be connected to the ground wiring of the printed wiring board 200. Since the ground wiring has a large conductor area, it provides a great effect of raising the temperature rising rate in a heating operation to further reduce the curing time of the thermosetting resin 400.

FIG. 1D schematically illustrates the finished printed circuit board 500. The reinforcement resin 401 that the cured thermosetting resin 400 is bonded around and reinforces the solder joints 302 of the printed circuit board 500 to raise the bonding reliability of the printed circuit board 500. This effect can be achieved not only for the LGA that is being employed for the electronic component 100 in this embodiment, but also for a BGA.

Figure 2A:
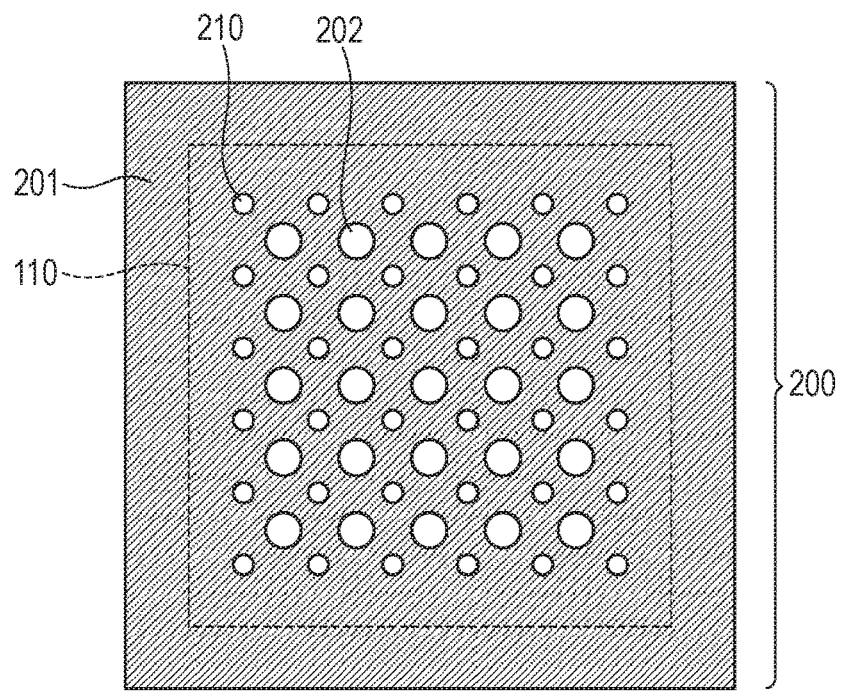
FIGS. 2A and 2B are schematic top views of printed wiring boards that can be used for the first through fourth embodiments provided in the first aspect of the present invention.
Figure 2B:
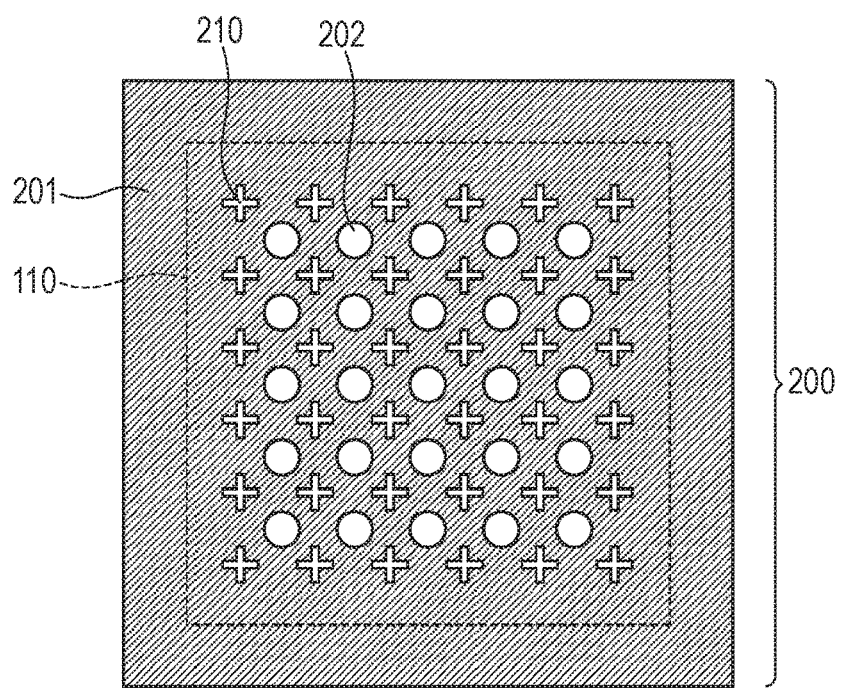

FIGS. 2A and 2B are schematic plan views of printed wiring boards 200 that can be used for the printed circuit board 500 in this first embodiment. A plurality of metal members 210 are shown in each of FIGS. 2A and 2B but the profile of the metal members 210 of FIG. 2A differs from that of the metal members 210 of FIG. 2B. The total area of the plurality of metal members 210 is smaller than the (total) area of the solder resist 201 in the mounting region 110 where the electronic component 100 is mounted on the mounting face of the printed wiring board 200.

As a result of the above-described arrangement, the part of the bonding area of the reinforcement resin 401 relative to the solder resist 201 can be made to be greater than the part of the bonding area of the reinforcement resin 401 relative to the metal members 210 on the printed circuit board 500. The bonding strength of resin is greater when resin is bonded to resin than when resin is bonded to metal. Thus, as a result of providing a large bonding area for the reinforcement resin 401 relative to the solder resist 201 containing resin as principal ingredient, the fall of bonding strength that arises when the metal members 210 are arranged can be minimized.

The profile of the metal members 210 is not limited to the round one as shown in FIG. 2A and the cross-shaped one as shown in FIG. 2B. The above-described effect can be achieved so long as the above area requirement is satisfied if the metal members 210 show any other profile such as rectangular or trigonal.

Second Embodiment

FIGS. 3A through 3D are schematic cross-sectional views of the second embodiment of printed circuit board 500 provided in the first aspect of the present invention, illustrating different manufacturing steps of the method of manufacturing the printed circuit board 500.

The second embodiment shown in FIGS. 3A through 3D differs from the first embodiment in that the metal members 211 are small lumps of solder (the second solder) formed on respective lands 210b. The metal members 211, which are small lumps of solder, are formed on the respective lands 210b in advance by solder plating, solder precoating or the like. Resin-containing solder paste 300a can be supplied by means of screen printing in the providing step shown in FIG. 3A. However, resin-containing solder paste 300a may alternatively be supplied by means of a dispenser when a satisfactory printing effect cannot be obtained because of the height of the metal members 211.

Figure 3A:
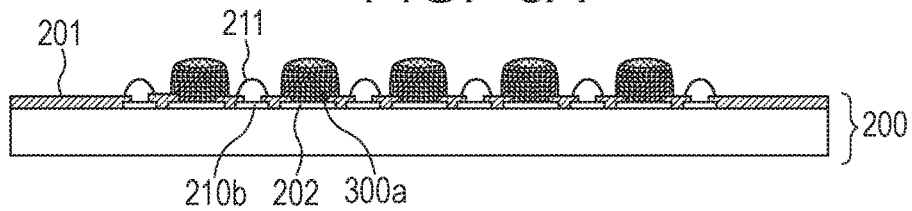
FIGS. 3A, 3B, 3C and 3D are schematic cross-sectional views of the second embodiment of printed circuit board provided in the first aspect of the present invention, illustrating different manufacturing steps of the method of manufacturing the same including the finished printed circuit board.
Figure 3B:
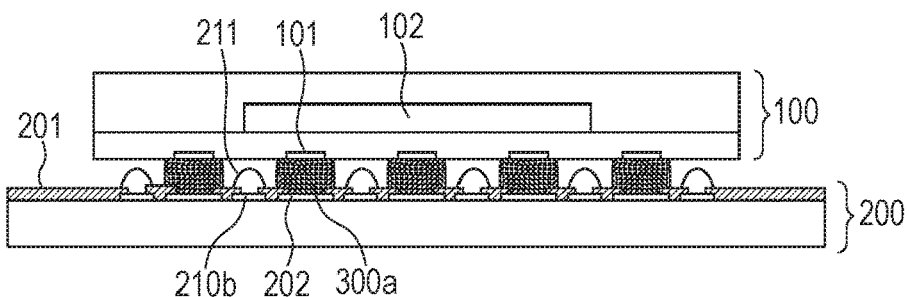
Figure 3C:
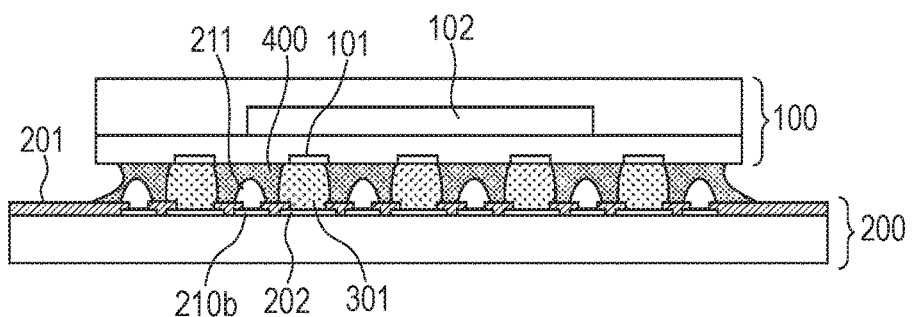
Figure 3D:
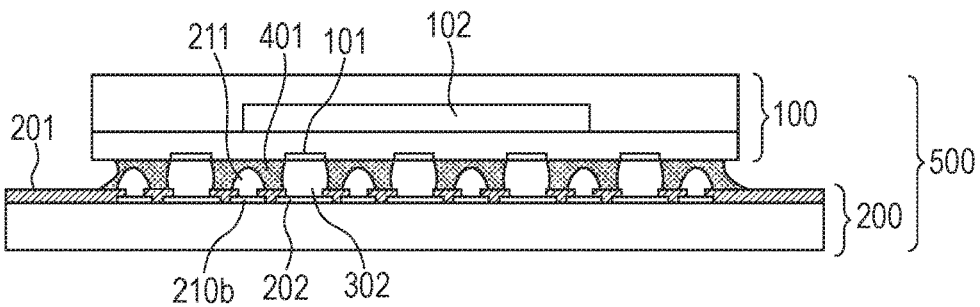

In the mounting step shown in FIG. 3B, an electronic component 100 is mounted on the printed wiring board 200 that carries the lands 210b thereon, on which the metal members 211 have respectively been formed and the lands 202 thereon, to which thermosetting resin-containing solder paste has been supplied. At this time, the electronic component 100 is mounted on the printed wiring board 200 such that the lands 202 of the printed wiring board 200 are respectively located vis-à-vis the corresponding lands 101 of the electronic component 100. FIG. 3C shows the solder bonding step of this embodiment and FIG. 3D shows the resin curing step of the embodiment. The solder of the metal members 211 provides the effect of accelerating the curing of the thermosetting resin 400 regardless if the solder is in the form of solid or in the form of liquid in these steps.

Otherwise, the second embodiment is the same as the first embodiment, although the volume of the spaces formed between the printed wiring board 200 and the electronic component 100 can be reduced by making the metal members 211 show a high three-dimensional profile as a result of using solder for the metal members 211. Then, consequently the thermosetting resin 400 can fill the gap between the printed wiring board 200 and the electronic component 100 to a greater extent if compared with the first embodiment. Thus, the reinforcement resin 401 is bonded to the bottom surface of the electronic component 100 over a greater area in the printed circuit board 500 to further improve the bonding reliability of the printed circuit board 500.

The second embodiment can be made as advantageous as the first embodiment by making the total sum of the surface areas of the metal members 211 not greater than the total surface area of the solder resist 201 in the mounting region 110 where the electronic component 100 is mounted on the printed wiring board 200.

Third Embodiment

FIGS. 4A through 4D are schematic cross-sectional views of the third embodiment of printed circuit board 500 provided in the first aspect of the present invention, illustrating different manufacturing steps of the method of manufacturing the printed circuit board 500.

The third embodiment illustrated in FIGS. 4A through 4D differs from the first and second embodiments in that metal members 212 are formed by the solder (the second solder) that is separated from thermosetting resin-containing solder paste 300b provided onto the lands 210b. The thermosetting resin-containing solder paste 300b that operates as supply source of the solder of the metal members 212 can be supplied simultaneously with thermosetting resin-containing solder paste 300a in the providing step shown in FIG. 4A. Then, as a result, it is no longer necessary to form the metal members 212 in advance by means of plating or precoating. Thus, the third embodiment can reduce the man hours necessary for manufacturing a printed circuit board if compared with the manufacturing steps of the second embodiment.

Figure 4A:
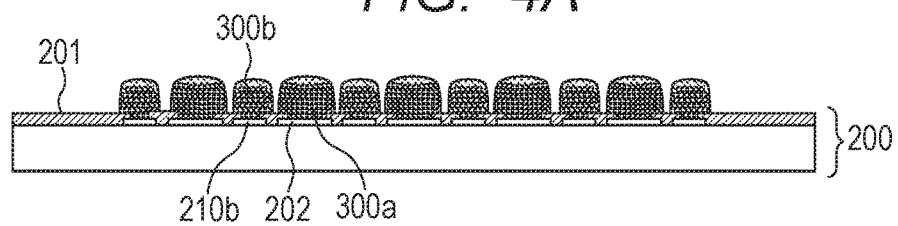
FIGS. 4A, 4B, 4C and 4D are schematic cross-sectional views of the third embodiment of printed circuit board provided in the first aspect of the present invention, illustrating different manufacturing steps of the method of manufacturing the same including the finished printed circuit board.
Figure 4B:
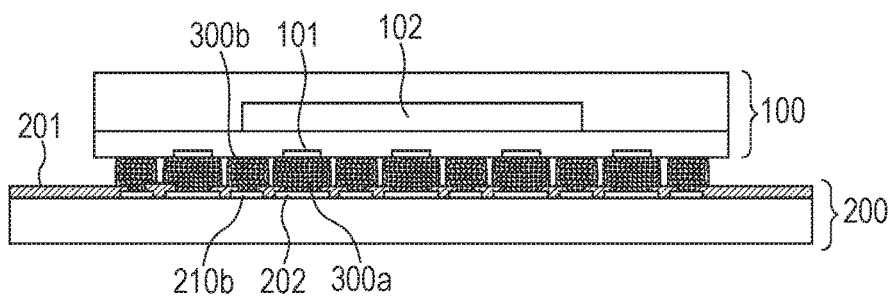
Figure 4C:
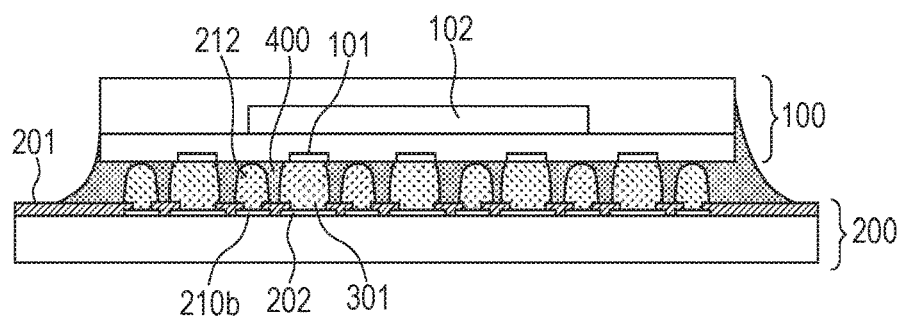
Figure 4D:
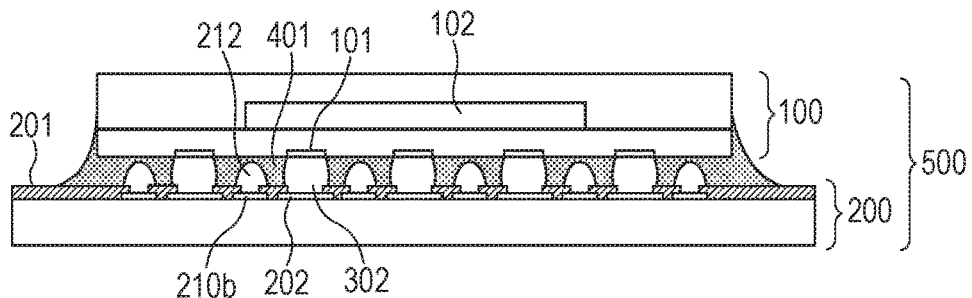

In the mounting step illustrated in FIG. 4B, an electronic component 100 is mounted on a printed wiring board 200 on which thermosetting resin-containing solder paste 300a has been supplied to the lands 202 and thermosetting resin-containing solder paste 300b has been supplied to the lands 210b. At this time, the electronic component 100 is mounted on the printed wiring board 200 such that the lands 202 of the printed wiring board 200 are respectively located vis-à-vis the corresponding lands 101 of the electronic component 100. Then, as the thermosetting resin 400 is separated from the thermosetting resin-containing solder paste 300b as shown in FIG. 4C, the volume of the reinforcement resin 401 that bonds the electronic component 100 and the printed wiring board 200 increases. As the volume of the reinforcement resin 401 increases, the area over which the reinforcement resin 401 is bonded to the electronic component 100 and the printed wiring board 200 in the printed circuit board 500 is further increased as shown in FIG. 4D to in turn further improve the reliability of the solder bonding.

Furthermore, the third embodiment can be made as advantageous as the first embodiment by making the total sum of the surface areas of the metal members 212 not greater than the total surface area of the solder resist 201 in the mounting region 110 where the electronic component 100 is mounted on the printed wiring board 200.

Fourth Embodiment

FIG. 1D schematically illustrates an exemplar cross-sectional view of the printed circuit board 500 of the fourth embodiment in the first aspect of the present invention. The printed circuit board 500 comprises an electronic component 100 and a printed wiring board 200 on which the electronic component 100 is mounted.

The electronic component 100 contains in the inside thereof a semiconductor element 102 mounted therein and a plurality of lands 101 (the first lands) are arranged on the bottom surface of the electronic component 100. A layer of solder resist 201 having a plurality of apertures is formed on the surface (the mounting face) of the printed wiring board 200 and lands 202 (the second lands) are respectively formed in the plurality of apertures.

The lands 101 of the electronic component and the corresponding lands 202 of the printed wiring board are electrically connected by way of respective solder joints 302. Additionally, metal members 210 are arranged in the respective apertures of the solder resist 201 on the surface (the mounting face) of the printed wiring board and reinforcement resin 401 is held in contact with the metal members 210 such that the peripheries of the solder joints 302 are reinforced by the reinforcement resin 401 that is bonded to the solder joints 302.

The bonding reliability of the solder joints 302 is enhanced by the reinforcement effect of the reinforcement resin 401 and the reinforcement resin 401 is cured at low temperature while being held in contact with the metal members 210. More specifically, the reinforcement resin 401 is cured while the thermal deformation of the electronic component 100 and that of the printed wiring board 200 are being suppressed. Therefore, if the printed circuit board 500 is deformed, it is deformed only to a small extent. Then, such a printed circuit board can consequently serve to downsize the electronic device to be mounted on the printed circuit board 500.

Additionally, with regard to the surface area of the printed wiring board 200 over which the reinforcement resin 401 is bonded to the printed wiring board 200, the area where the reinforcement resin 401 is bonded to the solder resist 201 is greater than the area where the reinforcement resin 401 is bonded to the metal members 210. Since the reinforcement resin 401 is bonded to the solder resist 201 showing strong bonding force over a large bonding area, the solder joints 302 show a high bonding reliability if the metal members 210 are arranged on the surface of the printed wiring board 200.

Note that the metal members 210 are preferably electrically connected to the ground wiring of the printed wiring board 200. If the metal members 210 are electrically floating, the metal members 210 can operate as an antenna and hence as a source of radiation noises. Such a problem can be avoided when the metal members 210 are connected to the ground wiring of the printed wiring board 200.

The metal members may be the lands 210 themselves that are arranged on the printed wiring board 200 or formed on the lands 210b arranged on the printed wiring board 200 by using solder just like the metal members 211 shown in FIG. 3D and the metal members 212 shown in FIG. 4D.

Fifth Embodiment

FIG. 5 is a schematic illustration of the configuration of the fifth embodiment of electronic device of the present invention provided in the first aspect of the present invention, which is a digital camera 600. Referring to FIG. 5, the digital camera 600 is an interchangeable lens type digital camera that comprises a main body 601 and a removable lens unit 602. The main body 601 includes printed circuit boards 520 and 530 that are manufactured by any of the methods of the first embodiment through the third embodiment.

The printed circuit board 520 has a structure where an imaging device 120, which is a semiconductor device, is mounted on a printed wiring board 220. The imaging device 120 is typically a CMOS (complementary metal oxide semiconductor) image sensor or a CCD (charge coupled device) image sensor. The printed circuit board 520 has a function of converting the light entering it through the lens unit 602 into electric signals.

The printed circuit board 530 has a structure where an image processing device 130, which is another semiconductor device, is mounted on a printed wiring board 230. The image processing device 130 is typically a digital signal processor. The printed circuit board 530 has a function of generating image data typically by executing signal processing operations such as signal correcting operations on the electric signals obtained by the printed circuit board 520.

Both of the printed circuit boards 520 and 530 show an improved bonding reliability because they are manufactured by any of the methods of the first embodiment through the third embodiment. Thus, this embodiment can provide an electronic device such as a digital camera 600 that shows an improved reliability.

Additionally, the manufacturing cost of the printed circuit board 520 and that of the printed circuit board 530 are lowered than ever because they are manufactured by any of the methods of the first embodiment the third embodiment. Therefore, this embodiment can provide an electronic device such as a digital camera 600 at reduced manufacturing cost.

(Acceleration of Curing of Thermosetting Resin by Metal Members)

An experiment was conducted to ensure the effect of using metal members for accelerating the curing of the thermosetting resin of the thermosetting resin-containing solder paste. This experiment will be described below by referring to FIGS. 6A through 6C.

The thermosetting resin-containing solder paste employed in the experiment contained bisphenol A type epoxy resin as thermosetting resin and a curing agent that reacts with the thermosetting resin. The alloy composition of the powdery solder was a eutectic composition of Sn-58Bi having a melting point of 139° C. and the average particle size of the powdery solder was 40 µm. The amount of powdery solder that was added to the solder paste, or the content ratio of powdery solder in the solder paste, was about 85 wt %, the balance being the thermosetting resin, the curing agent and a flux component for securing the bonding property of solder, the content ratio of the flux component being very small.

Figure 6A:
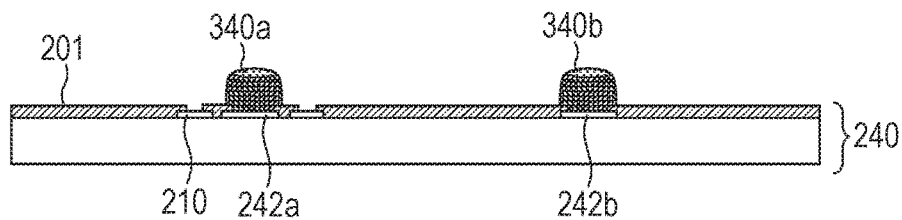
FIGS. 6A, 6B and 6C are schematic cross-sectional views of an embodiment provided in the first aspect of the present invention, illustrating the sequence of an exemplar experiment conducted for the embodiment.

The printed wiring board 240 employed for the experiment was to look into the catalytic effect of accelerating the curing of the thermosetting resin by metal members. A land 242a and a land 242b were arranged in the respective apertures of solder resist 201. As shown in FIG. 6A, the land 242a differed from the land 242b in that lands were arranged as metal members 210 around the land 242a by way of solder resist 201. The metal members 210 were lands arranged on the printed wiring board 240. Both the land 242a and the land 242b were made of copper.

The technique as described below was employed for the confirmation experiment of looking into the difference, if any, in the cured state of the reinforcement resin by using the reinforcement resin-containing solder paste and the printed wiring board 240 as described above.

Firstly, as shown in FIG. 6A, thermosetting resin-containing solder paste 340a was provided to the land 242a and thermosetting resin-containing solder paste 340b was provided to the land 242b by means of a printing plate having a plate thickness of 200 µm.

Figure 6B:
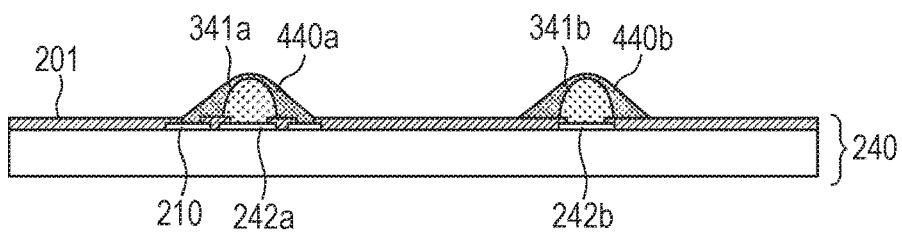

Then, as shown in FIG. 6B, the solders contained in the thermosetting resin-containing solder paste 340a and the thermosetting resin-containing solder paste 340b were caused to melt by heating them. The molten solder 341a and the molten solder 341b were respectively separated from the thermosetting resin 440a and the thermosetting resin 440b and both the thermosetting resin 440a and the thermosetting resin 440b are caused to cure.

At this time, the thermosetting resin 440a that had been separated from the thermosetting resin-containing solder paste 340a provided onto the lands 242a was heated and cured in a state where it was fluidized and brought into contact with the metal members 210. On the other hand, the thermosetting resin 440b that had been separated from the thermosetting resin-containing solder paste 340b provided onto the land 242b was heated and cured in a state where it was held in contact with the solder resist 201.

Figure 6C:
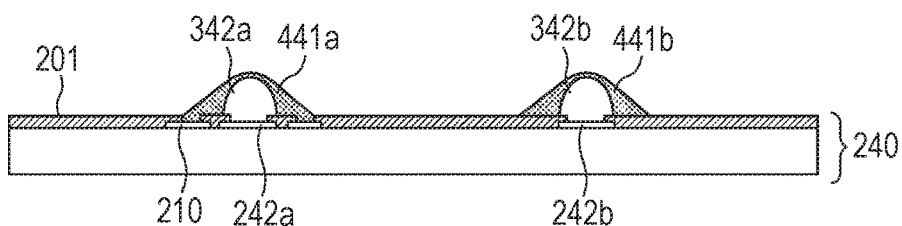

FIG. 6C shows that, after the heating process, the molten solder 341a and the molten solder 341b were solidified to respectively become solid solder 342a and solid solder 342b, while the curing of both the thermosetting resin 440a and the thermosetting resin 440b had ended to respectively become reinforcement resin 441a and reinforcement resin 441b. To compare the cured reinforcement resin 441a and the cured reinforcement resin 441b, the hardness of the reinforcement resin 441a and that of the reinforcement resin 441b were measured by means of a Vickers hardness tester. Table 1 below shows the obtained results.

TABLE 1

Vickers Harness (Hv) of Two Reinforcement Resins

| | reinforcement resin | |
|---|---|---|
| | 441a contacting metal members | 441b not contacting metal members |
| hardness on solder | 14-16 | 14-16 |
| hardness around solder | 14-16 | 2-14 |

As seen from Table 1, the reinforcement resin 441a separated from the reinforcement resin-containing solder paste 340a that had been provided onto the land 242a showed a degree of hardness [Hv] that is not lower than 14 both on the solder 342a and around the land 242a. This means that the curing of the reinforcement resin 441a located at positions that were separated from the solder 342a had progressed probably because the molten solder 341a and the metal members 210 operated as catalyst for accelerating the curing of the thermosetting resin 440a.

On the other hand, while the reinforcement resin 441b separated from the reinforcement resin-containing solder paste 340b that had been provided onto the land 242b showed a degree of hardness [Hv] that is not lower than 14 on the solder 342b, the hardness of the reinforcement resin 441b showed variations as the distance from the solder 342b to the reinforcement resin 441b increased. Furthermore, the reinforcement resin 441b had not cured at some spots. This was probably because the solder resist 201 did not have any effect of accelerating the curing of thermosetting resin and hence the curing of thermosetting resin 440b was insufficient at positions separated from the solder 342b by a relatively large distance.

From the above-described results of the experiment, it was found that curing of thermosetting resin is accelerated when thermosetting resin is heated in a state where it is held in contact with metal such as solder or copper to provide an effect of reducing the curing time.

[Manufacturing of Printed Circuit Board]

A printed circuit board 500 was manufactured by mounting an electronic component 100 on a printed wiring board 200 and bonding the electronic component 100 to the printed wiring board 200 according to the method illustrated in FIGS. 1A through 1D. The lands 202 and metal members 210 are arranged on the mounting face of the employed printed wiring board 200, as schematically illustrated in FIG. 2B.

The electronic component 100 mounted on the printed wiring board 200 was an imaging device carrying a CMOS image sensor of APS-C size mounted thereon. The external dimensions of the electronic device 100 as viewed from above was about 35.0 mm×28.0 mm. The imaging device was of the LGA type. The material of the bottom surface of the electronic component 100 was alumina ceramic and the external terminals (lands) arranged on the bottom surface had a diameter of φ1.0 mm and arranged at a pitch of 1.6 mm to form a grid.

On the other hand, the printed wiring board 200 was formed by using a base member of FR-4 (Flame Retardant Type 4) and had external dimensions as viewed above of 50.0×50.0 mm. Solder resist 201 was arranged on the surface of the printed wiring board 200 and a plurality of φ1.0 mm lands 202 were arranged on the respective apertures thereof. At least one or more than one metal member 210 are arranged around each of the lands 202 and each of the metal members 210 had a cross-shaped profile as shown in FIG. 2B that was formed by arranging two 0.2 mm-wide and 1.2 mm-long linear lands. The lands 202 and the metal members 210 contained copper as principal ingredient.

In the providing step of FIG. 1A, thermosetting resin-containing solder paste 300a was supplied to the plurality of lands 202 of the printed wiring board 200 by means of a printing plate having a plate thickness of 200 µm.

In the mounting step of FIG. 1B, the electronic component 100 was mounted on the printed wiring board 200 by means of a mounter such that the lands 101 of the electronic component 100 are respectively located vis-à-vis the corresponding lands 202 of the printed wiring board 200. At this time, pressure was applied to the electronic component 100 and the printed wiring board 200 such that the lands 101 of the electronic component 100 were respectively brought into contact with the corresponding small lumps of the thermosetting resin-containing solder paste 300a but any adjacently located small lumps of thermosetting resin-containing solder paste 300a did not contact each other.

Figure 7:
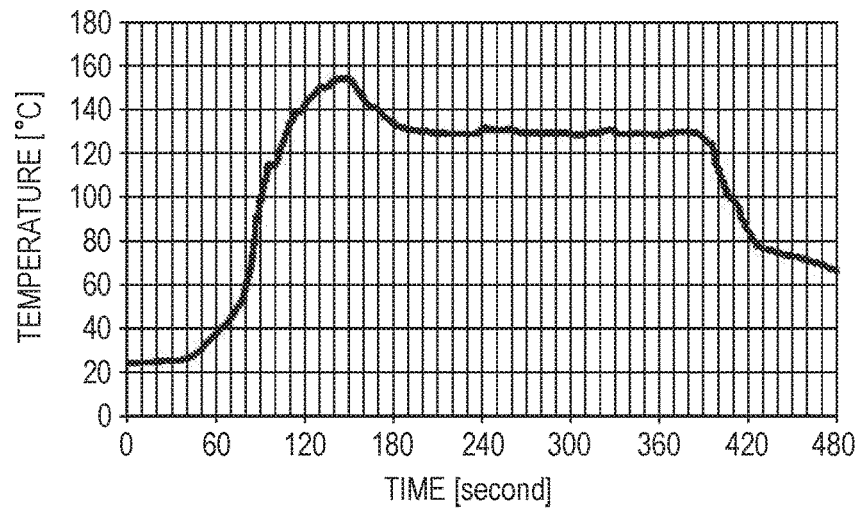
FIG. 7 is a graph illustrating the heating temperature profile observed in the exemplar experiment conducted for the embodiment shown in FIGS. 6A, 6B and 6C.
Figure 8:
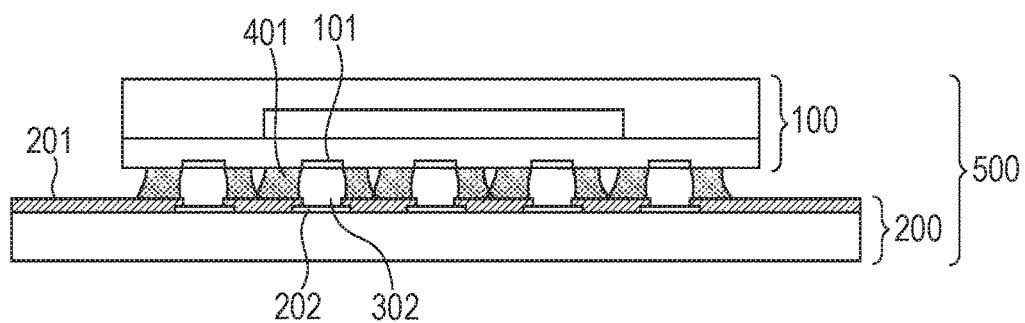
FIG. 8 is a schematic cross-sectional view of the printed circuit board manufactured by means of a known manufacturing method using solder paste that contains thermosetting resin.

In the heating step of FIGS. 1C and 1D, the solder was heated quickly to its melting point of 139° C. according to the heating temperature profile shown in FIG. 7 so as to melt the solder at a time without preliminarily heating the solder in advance in order to prevent the thermosetting resin 400 from curing before the solder was molten. At this time, the molten solder was separated from the thermosetting resin-containing solder paste 300a and aggregated. Then, the solder spread over the lands 101 and the lands 202 and solder joints were formed by the molten solder 301. On the other hand, the thermosetting resin 400 separated from the molten solder was pushed out to the outer peripheries of the small lumps of molten solder 301 that formed solder joints and became fluidized so as to be brought into contact with the metal members 210.

Thereafter, the solder was cooled to about 130° C., which was below the melting point of the solder, as shown in FIG. 7, to solidify the solder joints. The thermosetting resin 400 was heated to cure in this state in order to produce a finished printed circuit board 500, in which the solder joints 302 were reinforced around the outer peripheries thereof by the cured thermosetting resin (reinforcement resin) 401.

In the manufactured printed circuit board 500, the plurality of lands 101 of the electronic component 100 and the corresponding plurality of lands 202 of the printed wiring board 200 had respectively been bonded to each other by way of the plurality of solder joints 302. Additionally, the solder joints 302 and their outer peripheries were reinforced by the reinforcement resin 401 that had been brought into contact with the metal members 210 so that it may be safe to say that the strength of the solder joints 302 had been improved.

(Evaluation of Printed Circuit Board)

The solder joints 302 of the printed circuit board 500 that was manufacture by the above-described manufacturing method were examined by means of an X-ray transmission observation apparatus to find no bonding failure such as solder bridge between adjacently located solder joints 302. Additionally, no conduction failure was observed as a result of an electric examination of the solder joints 302.

The imaging device that was mounted as electronic component 100 showed thermal deformation only to a minimum extent because the resin curing step was executed at 130° C., which was lower than the melting point of the solder. Thus, the optical performance of the contained CMOS image sensor could be satisfactorily guaranteed.

Then, the electronic component 100 was ripped off from the printed wiring board 200 to look into the solder joints 302 and the reinforcement resin 401. It was found that the lands 101 of the electronic component 100 and the corresponding lands 202 of the printed wiring board 200 had respectively firmly been bonded together with the solder spreading over the pairs of lands 101 and 202. No trace of interference by the thermosetting resin 400 with the solder bonding was detected.

The state of the reinforcement resin 401 was visually observed after the ripping off to find that the reinforcement resin 401 had been peeled off from only a small number of the metal members 210 at the metal-resin interfaces thereof, while there was no peel-off of the reinforcement resin 401 from the solder resist 201, but rather the solder resist 201 had more conspicuously been peeled off from the printed wiring board 200. This fact evidences that the reinforcement resin 401 was sufficiently cured and bonded to the solder resist 201 with strong bonding force.

Subsequently, the solder resist 201 that was peeled off from the printed wiring board 200 but remained bonded to the reinforcement resin 401 was scraped off and the hardness of the reinforcement resin 401 was observed by means of a Vickers hardness tester to find that the reinforcement resin 401 showed a degree of hardness substantially the same as the one shown in Table 1. This fact also evidences that the reinforcement resin 401 was satisfactorily cured.

From the above-described results, it was found that any reduction in the reinforcement effect of the reinforcement resin 401 can be suppressed by making the total area of the metal members 210 that were only weakly bonded to the reinforcement resin 401 smaller than the total area of the solder resist 201 in the mounting region 110 of the electronic component 100.

(B) Second Aspect

Now, embodiments of the present invention in the second aspect of the invention will be described below.

(Solder Joint)

Figure 9A:
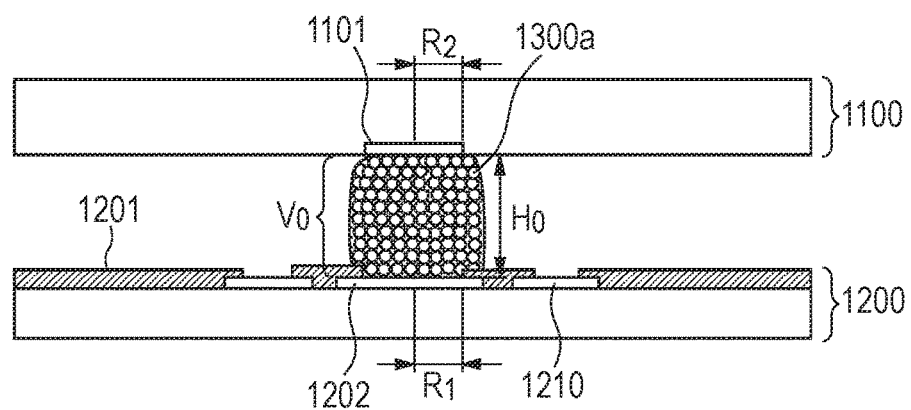
FIGS. 9A and 9B are schematic cross-sectional views of the solder joint and its vicinity of one of the terminals of a printed circuit board manufactured by the method of manufacturing a printed circuit board in the second aspect of the present invention.
Figure 9B:
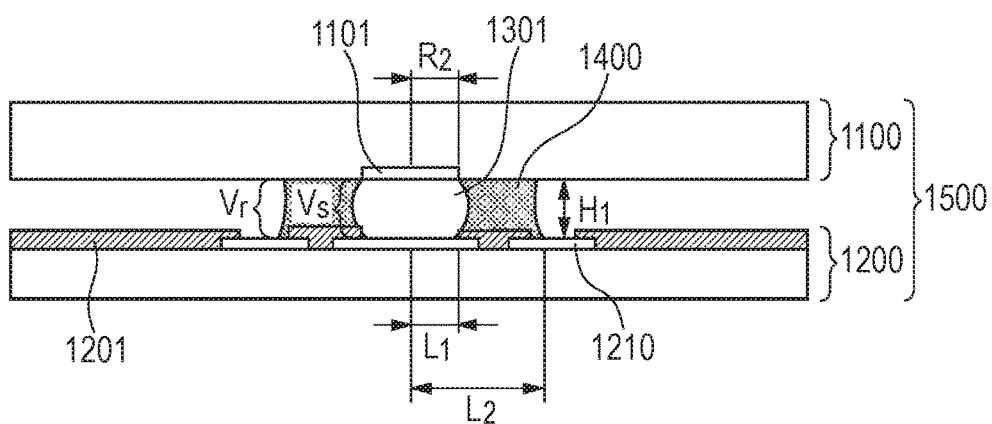

FIGS. 9A and 9B are schematic cross-sectional views of the solder joint and its vicinity of one of the terminals of a printed circuit board manufactured by the method of manufacturing a printed circuit board in the second aspect of the present invention.

The method of manufacturing a printed circuit board in the second aspect of the present invention will be described below by referring to FIGS. 9A and 9B. In the printed circuit board, the thermosetting resin contained in the thermosetting resin-containing solder paste 1300a of this embodiment is brought into contact with metal members.

FIG. 9A is an enlarged schematic cross-sectional view of one of the terminals of the printed wiring board 1200, in which thermosetting resin-containing solder paste 1300a has already been supplied onto one of the second lands 1202 of the printed wiring board 1200 having a radius of $R_1$ and arranged in one of the apertures of the solder resist 1201 formed on the mounting face of the printed wiring board 1200 and an electronic component 1100 has already been mounted on the printed wiring board 1200 and one of its first lands 1101 having a radius of $R_2$ is located vis-à-vis the second land 1202. More specifically, thermosetting resin-containing solder paste 1300a has been supplied by a volume of $V_0$ to show a height of $H_0$.

FIG. 9B shows a state in which the printed wiring board 1200 carrying the electronic component 1100 mounted thereon is heated so that the thermosetting resin-containing solder paste 1300a is molten and separated into molten solder 1301 and thermosetting resin 1400.

As the powdery solder in the thermosetting resin-containing solder paste 1300a is molten, it becomes clumpy and aggregates between the first land 1101 and the corresponding second land 1202 to become the molten solder 1301. At the same time, the thermosetting resin 1400 spreads out from between the first land 1101 and the second land 1202 so that the height thereof is reduced from $H_0$ to $H_1$. For this reason, the thermosetting resin 1400 spreads between the electronic component 1100 and the printed wiring board 1200 so as to get to positions separated from the centers of the second land 1202 by distance $L_2$, covering the outer periphery of the molten solder 1301.

The sum of the volume $V_s$ of the molten solder 1301 and the volume $V_r$ of the thermosetting resin 1400 is equal to the volume $V_0$ of the thermosetting resin-containing solder paste 1300a before the separation so that the relationship of $V_0$, $V_s$ and $V_r$ is expressed by the formula shown below:

$$V_0 = V_s + V_r$$

where $V_0$ [mm³] is the volume of the thermosetting resin-containing solder paste, $V_s$ [mm³] is the volume of the molten solder and $V_r$ [mm³] is the volume of the thermosetting resin.

In other words, the distance $L_2$ by which the thermosetting resin 1400 spreads is equal to the distance by which the thermosetting resin-containing solder paste 1300a showing a volume of $V_0$ spreads as a result of being pressed down to reduce its height from $H_0$ to $H_1$.

When the radius $R_2$ of the first land 1101 is equal to the radius $R_1$ of the second land 1202, both the molten solder 1301 and the thermosetting resin 1400 become to show a quasi-cylindrical profile and show the same height. Therefore, the radius of the bottom surface of the cylinder of the molten solder 1301 and the radius of the bottom surface of the cylinder formed by the molten solder 1301 and the thermosetting resin 1400 can be determined from the volume $V_s$ of the molten solder 1301 and the volume $V_r$ of the thermosetting resin 1400. The radius of the bottom surface of the cylinder of the molten solder 1301 is equal to the distance $L_1$ by which the molten solder 1301 spreads and also to the radius $R_1$ of the second land 1201.

The radius of the bottom surface of the cylinder formed by the molten solder 1301 and the thermosetting resin 1400 is equal to the distance $L_2$ by which the thermosetting resin 1400 spreads from the center of the second land 1202 and hence equal to the distance by which the crushed thermosetting resin-containing solder paste 1300a spreads as described above, and hence, it can be determined from the radius $R_1 = L_1$, of the bottom surface of the cylinder having a volume of $V_0$.

In other words, the distance $L_2$ by which the thermosetting resin 1400 spreads from the center of the second land 1202 is equal to $L_1$ multiplied by the square root of (the volume $V_0$ of the thermosetting resin-containing solder paste 1300a/ the volume $V_s$ of the molten solder 1301) and hence can be expressed by the formula show below.

$$L_2 = R_1 \times \sqrt{(V_0/V_s)}$$

When the volume fraction of the solder in the thermosetting resin-containing solder paste 1300a is $W_s$ [vol %], $$V_0/V_s = W_s$$

and therefore the following equation is obtained:

$$L_2 = R_1 \times \sqrt{\{1/(W_s/100)\}}$$

Namely, the distance $L_2$ by which the thermosetting resin 1400 spreads from the center of the second land 1202 can be obtained by measuring the volume fraction $W_s$ [vol %] of the solder in the thermosetting resin-containing solder paste 1300a.

Then, as the value of $L_2$ is determined, the thermosetting resin 1400 can be brought into contact with the metal members 1210 by arranging the metal members 1210 within the distance $L_2$ from the center of the second land 1202 with the solder resist 1201 arranged between them as shown in FIG. 9B. Then, as the thermosetting resin 1400 is heated while it is held in contact with the metal members 1210, the rate at which the thermosetting resin 1400 cures can be raised.

Additionally, when the radius $R_1$ of the second land 1202 differs from the radius $R_2$ of the first land 1101, $L_2$ can be expressed by the formula shown below:

$$L_2 = \sqrt{\{(R_1^2 + R_1 R_2 + R_2^2)/3(W_s/100)\}}$$

For example, both the first land 1101 of the electronic component 1100 and the second land 1202 of the printed wiring board 1200 show a value of φ1.0 mm and thermosetting resin-containing solder paste 1300a, in which the volume fraction $W_s$ of solder is 40 [vol %], is to be supplied, $L_2$ can be determined as shown below.

$$L_2 = \sqrt{\{(0.5^2 \times 0.5 \times 0.5 \times 0.5^2)/3 \times (40/100)\}} = 0.79 \text{ mm}$$

It will be seen from the above-described result, it suffices that metal members 1210 are arranged within the distance of 0.79 mm from the center of the second land 1202 so as not to contact the second land 1202.

Thus, by arranging metal members 1210 within the distance $L_2$ from the center of the second land 1202, by which the thermosetting resin 1400 spreads, the metal members 1210 operate as catalyst in a heating operation to accelerate the curing of the thermosetting resin 1400 so that the thermosetting resin 1400 can cure at low temperature within a short period of time.

For the above-described reason, the cost of manufacturing a printed circuit board 1500 can be reduced, while suppressing the thermal deformation, if any, of the printed circuit board.

(Manufacturing of Printed Circuit Board)

Sixth Embodiment

Now, the sixth embodiment of method of manufacturing a printed circuit board in the second aspect of the present invention will be described below by referring to the related drawings.

Firstly, thermosetting resin-containing solder paste 1300a to be used for this method will be described.

Thermosetting resin-containing solder paste 1300a is solder paste that contains at least powdery solder and thermosetting resin. It may additionally contain a flux component that is necessary for soldering.

Just like ordinary solder paste, thermosetting resin-containing solder paste 1300a can be supplied by means of screen printing or a dispenser and used for solder bonding by means of the technique of reflow soldering and heating.

However, thermosetting resin-containing solder paste differs from ordinary solder paste in that, as powdery solder is molten at the time of heating for reflow soldering, thermosetting resin 1400 is separated from thermosetting resin-containing solder paste 1300a and the thermosetting resin 1400 cures on and around molten solder to participate in the bonding process. In other words, the thermosetting resin contained in thermosetting resin-containing solder paste operates as reinforcement resin.

For this reason, bonding of an electronic component 1100 and a printed wiring board 1200 is reinforced to improve the bonding reliability of the printed circuit board 1500 by using thermosetting resin-containing solder paste 1300a.

FIGS. 10A through 10D are schematic cross-sectional views of the printed circuit board 1500 shown in FIG. 9A, showing different manufacturing steps thereof.

Figure 10A:
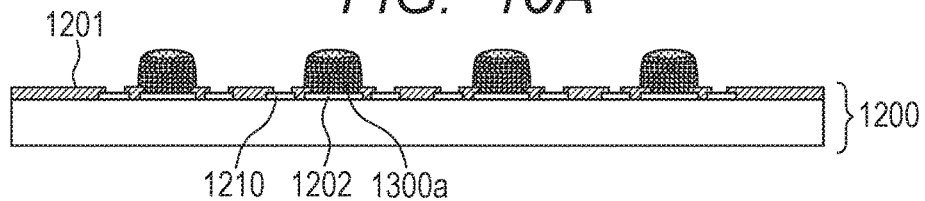
FIGS. 10A, 10B, 10C and 10D are schematic cross-sectional views of the sixth embodiment of printed circuit board provided in the second aspect of the present invention, illustrating different manufacturing steps of the method of manufacturing the same including the finished printed circuit board.

FIG. 10A is a schematic illustration of the providing step of providing thermosetting resin-containing solder paste 1300a onto the second lands 1202 formed on the printed wiring board 1200.

As described above, the thermosetting resin-containing solder paste 1300a can be supplied by means of screen printing or a dispenser.

As shown in FIG. 10A, metal members 1210 are arranged around the second lands 1202 with solder resist 1201 disposed between them.

With the method of manufacturing a printed circuit board in the second aspect of the present invention, the distance from the center of each of the second lands 1202 to the metal members 1210 arranged around the second land 1202 is equal to the distance $L_2$ by which thermosetting resin 1400 can spread from the center of the second land 1202. If the radius of each of the first lands 1101 is $R_2$, the radius of each of the second lands 1202 is $R_1$ and the volume fraction of the solder in the thermosetting resin-containing solder paste 1300a is $W_s$, the metal members 1210 arranged around each of the second lands 1202 need to be separated from a distance not greater than $L_2 = \sqrt{\{(R_1^2 + R_1R_2 + R_2^2)/3(W_s/100)\}}$ but located out of the range where the metal members 1210 contact the second land 1202.

Figure 10B:
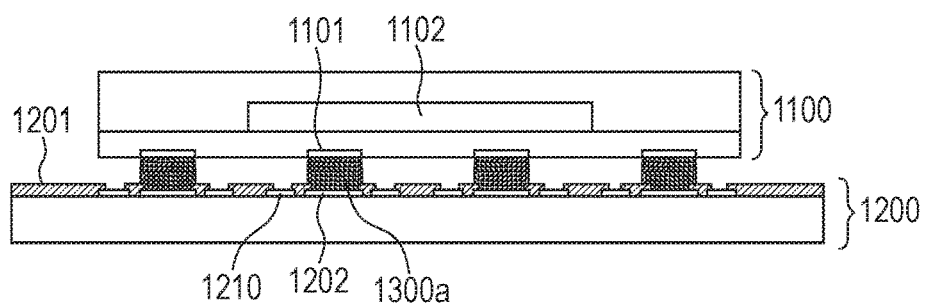

FIG. 10B schematically illustrates the mounting step of mounting an LGA type electronic component 1100 on the printed wiring board 1200, to which thermosetting resin-containing solder paste 1300a has already been supplied, by means of a mounter.

A semiconductor element 1102 is already mounted on the electronic component 1100 and a plurality of first lands 1101 are arranged on the bottom surface of the electronic component 1100.

Note that the first lands 1101 of the electronic component 1100 are arranged at respective positions located vis-à-vis the second lands 1202 of the printed wiring board 1200 to which the electronic component 1100 is to be bonded.

Figure 10C:
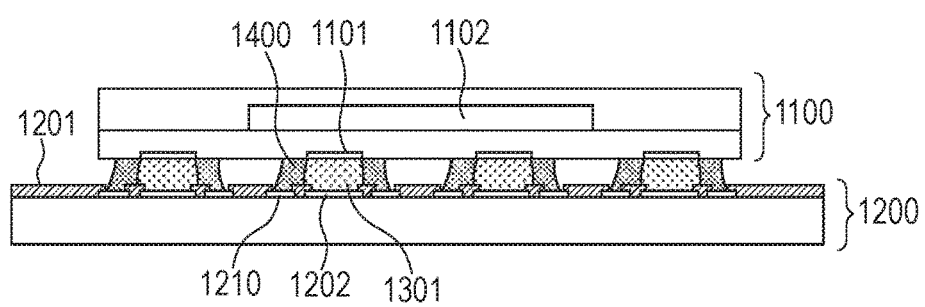

FIG. 10C schematically illustrates the solder bonding step of melting the thermosetting resin-containing solder paste 1300a and executing a bonding operation and also the resin curing step of curing the thermosetting resin 1400 after the completion of the solder bonding operation.

The solder bonding step can be executed in a reflow furnace and the resin curing step may be executed immediately after the solder bonding step in the reflow furnace so as to allow the heating operation to continue.

However, if the reflow furnace is small in size and/or an enough time cannot be secured for the resin curing step, the resin curing step may be executed in a separate heating furnace after the reflow soldering operation.

Firstly, in the solder bonding step, the thermosetting resin-containing solder paste 1300a is molten and the molten solder 1301 and the thermosetting resin 1400 are separated from each other so that the molten solder 1301 bonds the first lands 1101 of the electronic component 1100 and the corresponding respective second lands 1202 of the printed wiring board 1200. At this time, the separated thermosetting resin 1400 spreads over the surface of the solder resist 1201 formed on the bottom surface of the electronic component 1100 and on the printed wiring board 1200 so as to be brought into contact with the metal members 1210 formed on the printed wiring board 1200. The metal members 1210 operate as catalyst in the curing reaction of the thermosetting resin 1400 to accelerate the curing of the thermosetting resin 1400 so that the metal members 1210 can reduce the curing time of the thermosetting resin 1400 that has been brought into contact with the metal members 1210. Additionally, since the metal members 1210 show a thermal conductivity higher than the solder resist 1201 containing resin as principal ingredient so that, once heated, the temperature of the metal members 1210 rises quickly and the metal members 1210 become hot in a short period of time to reduce the curing time of the thermosetting resin 1400. At this time, the metal members 1210 may be electrically held in contact with the ground wiring (not shown) of the printed wiring board 1200. Since the electric conductor of the ground wiring has a large surface area, the temperature of the metal members 1210 rises further quickly during the heating operation to further reduce the curing time of the thermosetting resin 1400.

The resin curing step is executed at a temperature lower than the solder bonding step to suppress the thermal damage and/or the thermal deformation, if any, of the printed wiring board 1200 and the electronic component 1100.

Figure 10D:
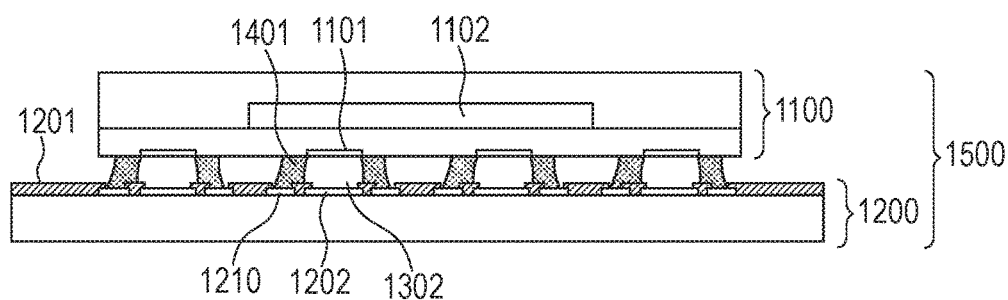

FIG. 10D is a schematic illustration of a finished printed circuit board 1500. In the printed circuit board 1500, the electronic component 1100 is mounted on the mounting face of the printed wiring board 1200 and the reinforcement resin 1401, which is the cured thermosetting resin 1400, is bonded to the outer peripheries of the solder joints 1302 so as to reinforce the solder joints 1302 and thereby raise the bonding reliability of the printed circuit board 1500. The electronic component 1100 is not necessarily of the LGA type and may alternatively be of the BGA type. In other words, advantages similar to those described above for the printed circuit board 1500 can be obtained if it comprises a BGA type electronic component 1100 instead of an LGA type electronic component 1100.

Figure 11A:
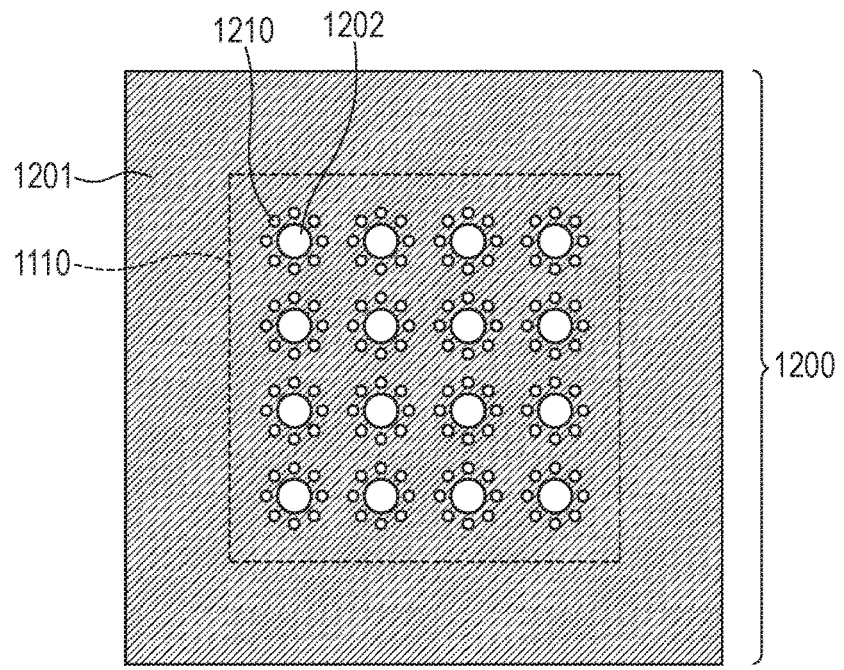
FIGS. 11A and 11B are schematic top views of printed wiring boards that can be used for the sixth through eighth embodiments of method of manufacturing a printed circuit board provided in the second aspect of the present invention.
Figure 11B:
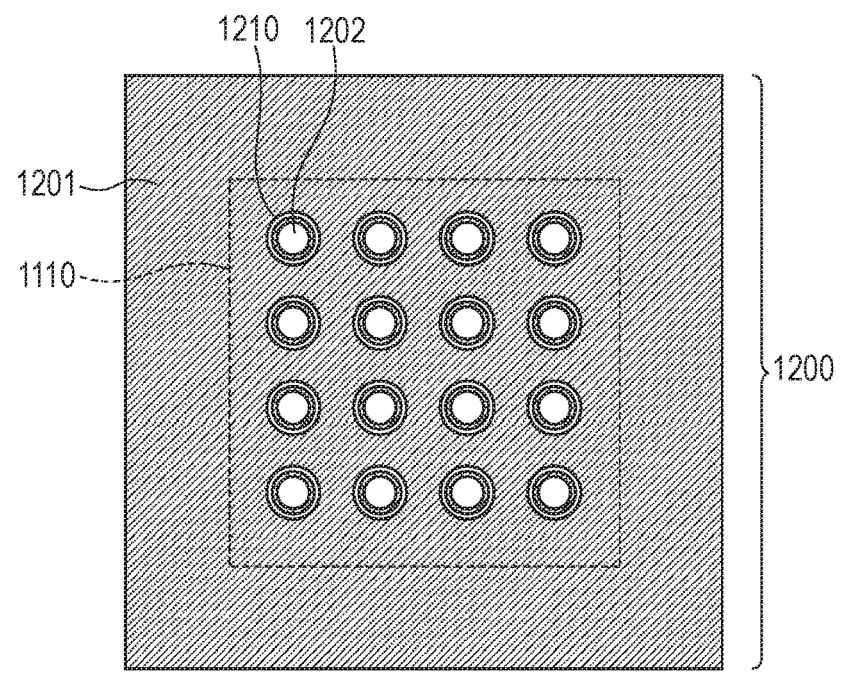

FIGS. 11A and 11B are schematic top views of printed wiring boards 1200 that can be used for the printed circuit boards 1500 shown in FIGS. 9A and 9B. A plurality of metal members 1210 are arranged around each of the apertures of the solder resist 1201 formed within the electronic component mounting region 1110 of each of the printed wiring board 1200 shown in FIGS. 11A and 11B. The profile of the metal members 1210 of FIG. 11A and the profile of the metal members 1210 of FIG. 11B differ from each other.

With regard to each of the apertures of the solder resist 1201, the plurality of metal members 1210 that surround the aperture are arranged at respective positions located within a distance of $L_2 = \sqrt{\{(R_1^2 + R_1R_2 + R_2^2)/3(W_s/100)\}}$ from the center of the center of the corresponding one of the second lands 1202 so as not to contact the second land 1202.

As shown in FIG. 11A, the probability with which the thermosetting resin 1400 contacts the metal members 1210 and the area over which the thermosetting resin 1400 contacts the metal members 1210 can be increased by arranging a relatively large number of metal members 1210 around the second land 1202.

As shown in FIG. 11B, on the other hand, by surrounding the outer periphery of the second land 1202 with a single ring-shaped metal member 1210, the thermosetting resin 1400 can reliably be made to contact the metal member 1210.

The profile of the metal members 1210 surrounding the second lands 1202 may not necessarily be like the one shown in FIG. 11A, where a plurality of small round plates are arranged as so many metal members 1210 to form a ring that surrounds each of the second lands 1202, or like the one shown in FIG. 11B, where a single ring-shaped metal member 1210 is arranged around each of the second lands 1202. In other words, the small round metal members of FIG. 11A may be replaced by so many small rectangular or triangular metal members and the single ring-shaped metal member of FIG. 11B may be replaced by a single rectangular or single triangular metal member to provide similar advantages so long as the above-described distance requirement is satisfied.

Seventh Embodiment

FIGS. 12A through 12D are schematic cross-sectional views of the seventh embodiment of method of manufacturing a printed circuit board 1500 provided in the second aspect of the present invention, illustrating different manufacturing steps of the manufacturing method.

Figure 12A:
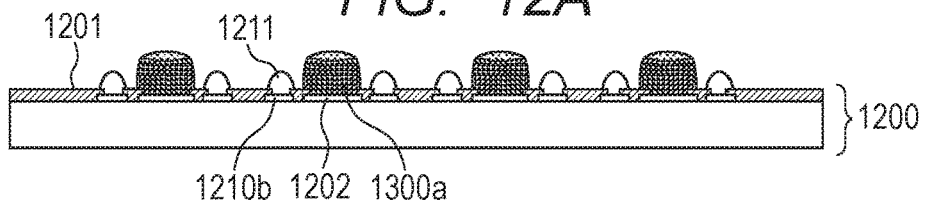
FIGS. 12A, 12B, 12C and 12D are schematic cross-sectional views of the seventh embodiment of printed circuit board provided in the second aspect of the present invention, illustrating different manufacturing steps of the method of manufacturing the same including the finished printed circuit board.
Figure 12B:
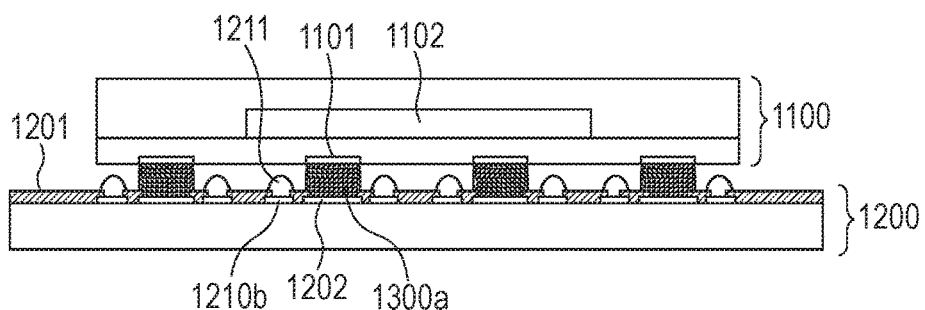

The seventh embodiment illustrated in FIGS. 12A through 12D differs from the sixth embodiment of method of manufacturing a printed circuit board in that metal members 1211 are respectively arranged on metal members 1210b as so many small lumps of second solder in this embodiment. The metal members 1211 that are the small lumps of second solder are formed on the respective metal members 1210b in advance by solder plating, solder precoating or the like. The metal members 1210b shown in FIG. 12A are actually the third lands arranged on the printed wiring board 1200.

In the thermosetting resin-containing solder paste providing step shown in FIG. 12A, thermosetting resin-containing solder paste 1300a can be supplied by means of screen printing, although the thermosetting resin-containing solder paste 1300a may alternatively be supplied by means of a dispenser when the screen printing performance is not satisfactory because of the height of the metal members 1211.

Figure 12C:
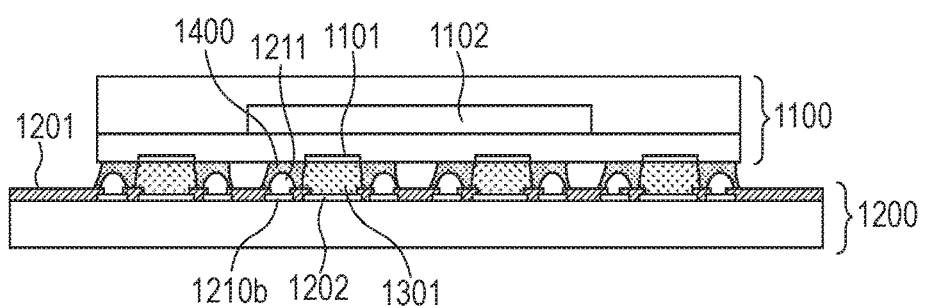

FIG. 12C shows the solder bonding step and the resin curing step. In the resin curing step, the metal members 1211, which is the small lumps of second solder, exerts the effect of accelerating the curing of the thermosetting resin 1400 regardless if it is in a solid state or in a molten state.

Figure 12D:
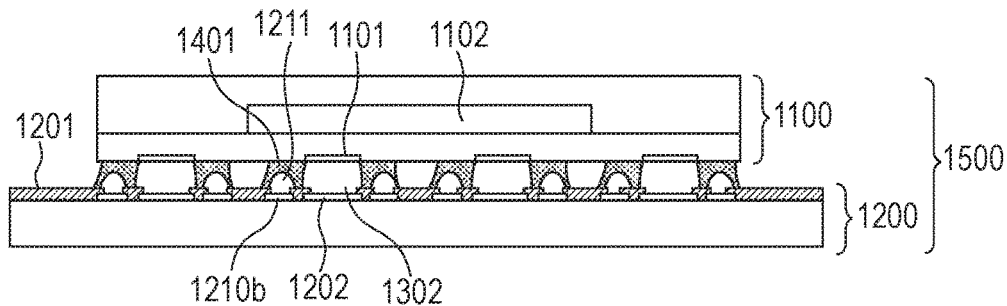

Otherwise, this embodiment is the same as the six embodiment of method of manufacturing a printed circuit board. This embodiment provides an advantage that the volume of the space produced between the printed wiring board 1200 and the electronic component 1100 can be minimized by making the metal members 1211, which is the small lumps of second solder, stand high. This advantage in turn raises the filling ratio of the thermosetting resin 1400 between the printed wiring board 1200 and the electronic component 1100 to increase the area over which the reinforcement resin 1401 contacts the bottom surface of the electronic component 1100 in the printed circuit board 1500, as shown in FIG. 12D.

With the above-described effect, the bonding reliability of the printed circuit board 1500 obtained by this embodiment of method of manufacturing a printed circuit board can further be improved if compared with the sixth embodiment of method manufacturing a printed circuit board.

Eighth Embodiment

FIGS. 13A through 13D are schematic cross-sectional views of a printed circuit board being manufactured by the eight embodiment of method of manufacturing a printed circuit board provided in the second aspect of the present invention, showing different manufacturing steps thereof.

The eighth embodiment of method of manufacturing a printed circuit board as illustrated in FIGS. 13A through 13D differs from the sixth and seventh embodiments of method of manufacturing a printed circuit board in that the metal members 1212 are formed by the metal members 1210b that are the small lumps of second solder molten and separated from the thermosetting resin-containing solder paste 1300b supplied onto the third lands.

Figure 13A:
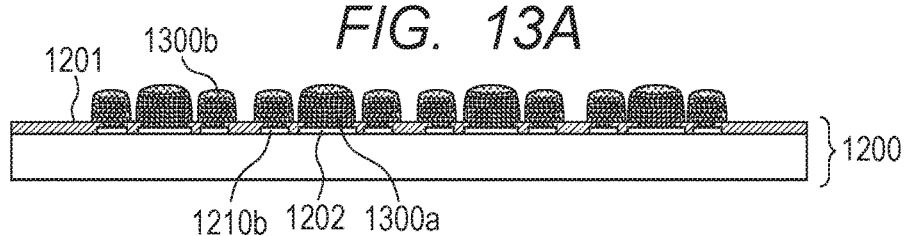
FIGS. 13A, 13B, 13C and 13D are schematic cross-sectional views of the eighth embodiment of printed circuit board provided in the second aspect of the present invention, illustrating different manufacturing steps of the method of manufacturing the same including the finished printed circuit board.
Figure 13B:
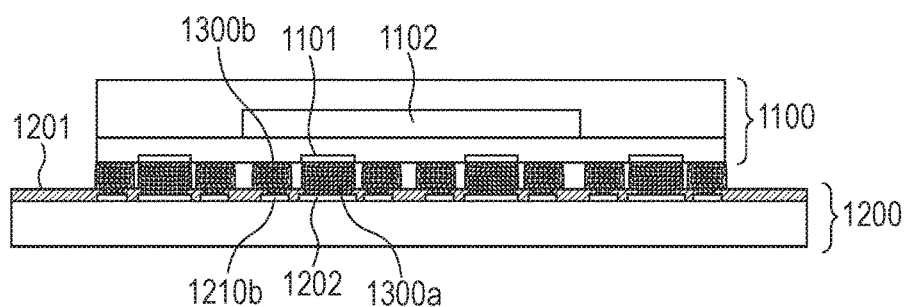

The thermosetting resin-containing solder paste 1300b that operates as source of supplying the metal members 1212 can be supplied simultaneously with the thermosetting resin-containing solder paste 1300a in the thermosetting resin-containing solder paste providing step shown in FIG. 13A. Then, as a result, it is no longer necessary to form the metal members 1212 in advance by means of plating or precoating so that the manufacturing steps of the eighth embodiment can reduce the man hours necessary for manufacturing a printed circuit board if compared with the manufacturing steps of the seventh embodiment.

Figure 13C:
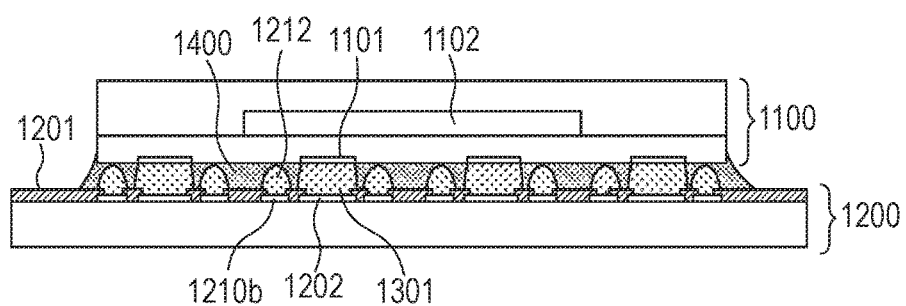
Figure 13D:
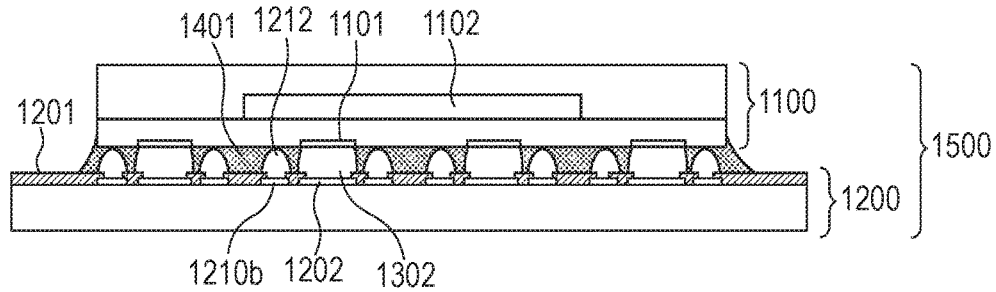

Furthermore, since thermosetting resin 1400 is separated from the thermosetting resin-containing solder paste 1300b just as it is separated from the thermosetting resin-containing solder paste 1300a in the bonding step as shown in FIG. 13C, the volume of the reinforcement resin 1401 to be used for bonding the electronic component 1100 and the printed wiring board 1200 is increased. Then, as the volume of the reinforcement resin 1401 is increased, the bonding area of the electronic component 1100 and the printed wiring board 1200 to be bonded by means of the reinforcement resin 1401 for the printed circuit board 1500 as shown in FIG. 13D is further increased to in turn further improve the bonding reliability of the printed circuit board 1500 if compared with the comparable embodiments.

(Measurement of Volume Fraction of Solder in Thermosetting Resin-Containing Solder Paste)

An experiment as described below was conducted in order to measure the volume fraction $W_s$ [vol %] of solder in thermosetting resin-containing solder paste.

Two different kinds of thermosetting resin-containing solder paste A were employed for the experiment (to be referred to as "paste A" hereinafter). The paste A contained bisphenol A-type epoxy resin as thermosetting resin and a curing agent that reacts with the epoxy resin. The alloy composition of the powdery solder of the paste A was a eutectic composition containing tin-bismuth that showed a melting point of 139° C. and a mass ratio of 42:58 and the average particle size of the powdery solder was 40 μm.

The volume fraction $W_s$ [vol %] of solder in the paste A was measured by means of the method that is described below.

(1) Measurement of the density [g/cm$^3$] of the solder paste
 (i) The weight a[g] of the specific gravity bottle to be used is measured.
 (ii) The weight b[g] of the specific gravity bottle filled with pure water is measured.
 (iii) (b[g]−a[g])/density of pure water [g/cm$^3$]=volume c [cm$^3$] of the specific gravity bottle is determined.
 (iv) After the specific gravity bottle is dried, the weight d[g] of the specific gravity bottle filled with the solder paste is measured.
 (v) d[g]−a[g]=weight e[g] of the solder paste is determined.
 (vi) The density [g/cm$^3$] of the solder paste is determined by using the following formula. The density [g/cm$^3$] of the solder paste=e[g]/c[cm$^3$]

(2) Measurement of Weight Fraction [wt %] of Solder Alloy in Solder Paste
(i) The weight f[g] of the crucible to be used is measured.
(ii) The weight g[g] of the crucible containing the thermosetting resin-containing solder paste is measured.
(iii) The crucible containing the solder paste is heated to the melting point of the solder to cause the solder to melt and aggregate so as to be completely separated from the thermosetting resin component.
(iv) After cooling the crucible, remove the resin remaining around the aggregated solder by washing and measure the weight h[g] of the solder alloy.
(v) Determine the weight fraction [wt %] of the solder in the solder paste by means of the formula shown below.

weight fraction of solder alloy [wt %]=$h[g]/(g[g]-f[g])\times 100$ (3) The volume fraction $W_s$ of the solder in the solder paste is determined by means of the formula shown below.

volume fraction of solder $W_s$ [vol %]=density of solder paste [g/cm$^3$]×weight fraction of solder alloy [wt %]/density of solder [g/cm$^3$], where the density of solder is 8.6 g/cm$^3$.
Table 2 shows the results of the measurement of the volume fraction of the solder in the paste.

TABLE 2

| results of measurement of volume fraction of solder [vol %] | |
|---|---|
| Paste | Paste A |
| diameter of powdery solder particle [μm] | 40 |
| density of paste [g/cm$^3$] | 3.93 |
| weight fraction of solder [wt %] | 84.9 |
| volume fraction of solder [vol %] | 38.8 |

(Acceleration of Curing of Thermosetting Resin by Metal Members)

The effect of acceleration of curing of the thermosetting resin contained in the thermosetting resin-containing solder paste by the metal members will be described below by referring to FIGS. 14A through 14C.

The difference in the cured condition of the reinforcement resin between an instance where metal members 1210 were employed and an instance where no metal members 1210 were employed was looked into by using thermosetting resin-containing solder paste 1300a and a printed wiring board 1200.

Paste A shown in Table 2 was employed as thermosetting resin-containing solder paste 1300a. The printed wiring board 1200 was for experimentally looking into the catalytic effect of metal members of accelerating the curing of thermosetting resin. A copper-made second land 1202a and another copper-made second land 1202b were arranged in the respective apertures of solder resist 1201. As shown in FIG. 14A, copper-made metal members 1210 were arranged around the second land 1202a by way of the solder resist 1201, so as to function as lands. To the contrary, no metal members 1210 were arranged around the second land 1202b.

Figure 14A:
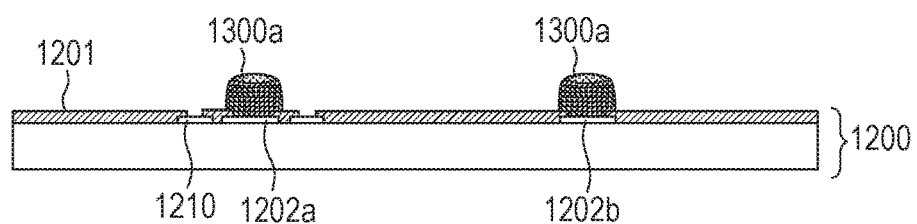
FIGS. 14A, 14B and 14C are schematic cross-sectional views of an embodiment provided in the second aspect of the present invention, illustrating the sequence of an exemplar experiment conducted for the embodiment.

As shown in FIG. 14A, thermosetting resin-containing solder paste 1300a was supplied to the second land 1202a and also to the second land 1202b by means of screening printing, using a printing plate having a plate thickness of 200 μm.

Figure 14B:
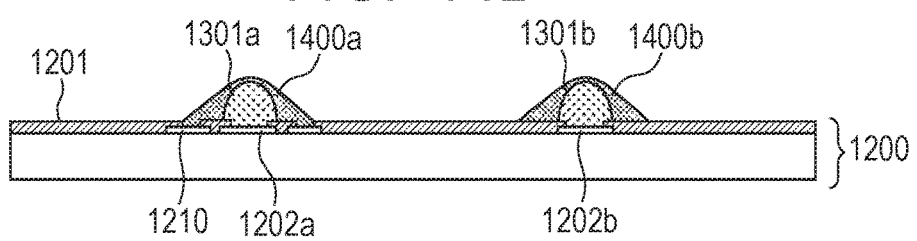

Then, as shown in FIG. 14B, the thermosetting resin-containing solder paste 1300a was heated to melt the solder in the thermosetting resin-containing solder paste 1300a in order to separate the molten solder 1301a and the molten solder 1301b respectively from the thermosetting resin 1400a and the thermosetting resin 1400b and then cause the thermosetting resin 1400a and the thermosetting resin 1400b to cure. At this time, the peripheral end of the thermosetting resin 1400a that was separated from the thermosetting resin-containing solder paste 1300a supplied onto the second land 1202a spread to the metal members 1210 so that the thermosetting resin 1400a was heated in a state where it was contacting the metal members 1210.

Figure 14C:
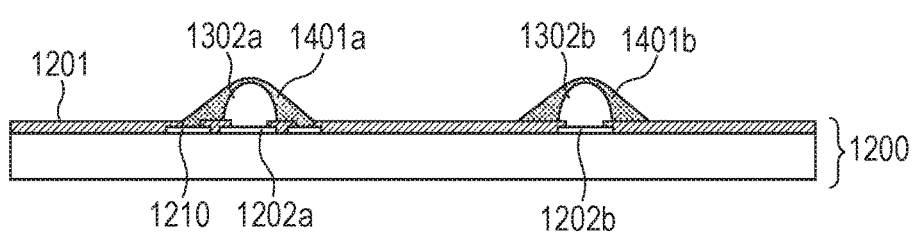

FIG. 14C shows a state where the solder 1302a and the solder 1302b that were to become solder joints after being cooled had already been solidified and the curing of the resin 1401a and the resin 1401b that were to become reinforcement resin had already been completed. For the sake of convenience, the solder 1302a and the solder 1302b that were to become solder joints are respectively referred to simply as solder 1302a and solder 1302b, while the resin 1401a and the resin 1401b that were to become reinforcement resins are referred to simply as reinforcement resin 1401a and reinforcement resin 1401b. In the above-described state, the hardness of the reinforcement resin 1401a and that of the reinforcement resin 1401b were measured by means of a Vickers hardness tester in order to compare the cured state of the reinforcement resin 1401a and that of the reinforcement resin 1401b.

TABLE 3

| Vickers Hardness [Hv] of Reinforcement Resin | | |
|---|---|---|
| | reinforcement resin | |
| | 1401a | 1401b |
| hardness on solder | 14-16 | 14-16 |
| hardness around solder | 14-16 | 2-16 |

The Vickers hardness [Hv] of the reinforcement resin 1401a was not less than 14 both on the solder 1302a and around the second land 1202a. These harness values evidenced that the curing of the reinforcement resin 1401a had progressed even at positions separated far from the solder so that it may be safe to say that both the molten solder 1301a and the metal members 1210 operated as catalyst for accelerating the curing of the thermosetting resin 1400a.

On the other hand, while the Vickers hardness [Hv] of the reinforcement resin 1401b was not less than 14 on the solder 1302b, it showed variations in the Vickers harness [Hv] as it was moved away from the solder 1302b. Furthermore, the thermosetting resin 1400b remained substantially uncured at some positions. This fact indicates that, since the solder resist 1201 did not have any effect of accelerating the curing of thermosetting resin, the thermosetting resin 1400b cured only insufficiently at positions separated from the solder 1302b by a relatively long distance.

Thus, the experiment proved that, as a result of heating the thermosetting resin while the thermosetting resin is held in contact with metal such as solder or copper, the curing of the thermosetting resin was accelerated to provide an effect of reducing the curing time.

(Printed Circuit Board Manufacturing Method)

Now, this embodiment of method of manufacturing a printed circuit board will be described below by referring to FIGS. 10A through 10D and 11A.

Paste A as described above was employed as thermosetting resin-containing solder paste 1300a.

An LGA type imaging device carrying a CMOS image sensor of the APS-C size mounted thereon and having external dimensions of about 35.0 mm×28.0 mm as viewed from above was employed as electronic component 1100. The first lands 1101, which were external terminals arranged on the bottom surface of the electronic component 1100, had a diameter of φ1.0 mm and are arranged at a pitch of 2.00 mm to form a grid. The bottom of the electronic component 1100 was made of alumina ceramic and the first lands 1101 were formed by arranging a Ni/Au plating layer on a tungsten-made wiring layer.

A printed wiring board 1200 formed on a base member of FR-4 (Flame Retardant Type 4) and having external dimensions of 50.0×50.0 mm as viewed from above was employed. Solder resist 1201 was arranged on the surface of the printed wiring board 1200 and copper-made second lands 1202 having a diameter of φ1.00 mm were arranged in the respective apertures of the solder resist. A plurality of round copper-made metal members 1210 having a diameter of φ0.2 mm were radially arranged around each of the second lands 1202 at positions separated by the same distance from the center of the second land 1202.

The metal members 1210 of each of the second lands 1202 were so arranged that the distance from the center of the second land 1202 to the proximal end of each of the metal members 1210 was shorter than the distance by which the paste A spreads from the center of the second land 1202.

Differently stated, by using the formula of $$L_2 = \sqrt{\{(R_1^2 + R_1 R_2 + R_2^2)/3(W_s/100)\}},$$

$$L_2 = \sqrt{\{(0.5^2 + 0.5 \times 0.5 + 0.5^2)/3(38.8/100)\}} = 0.803$$

was obtained. Thus, the metal members 1210 were so arranged that the center of each of the metal members 1210 was separated from the center of the second land 1202 by 0.8 mm to make the distance from the center of the second land 1202 to the proximal end of each of the metal members 1210 equal to 0.70 mm.

The printed circuit board was manufactured in the following manner.

As shown in FIG. 10A illustrating the solder paste providing step, thermosetting resin-containing solder paste 1300a was supplied to the plurality of second lands 1202 of the printed wiring board 1200 by means of screen printing using a printing plate having a plate thickness of 200 μm.

Then, as shown in FIG. 10B illustrating the mounting step, the electronic component 1100 was mounted on the printed wiring board 1200 such that the first lands 1101 of the electronic component 1100 was located vis-à-vis the respective corresponding second lands 1202 of the printed wiring board 1200. The applied pressure at the time of the mounting operation was such that the first lands 1101 of the electronic component 1100 were brought into contact with the respective corresponding small lumps of thermosetting resin-containing solder paste 1300a but any adjacently located ones of the small lumps of thermosetting resin-containing solder paste 1300a did not contact each other.

Figure 15:
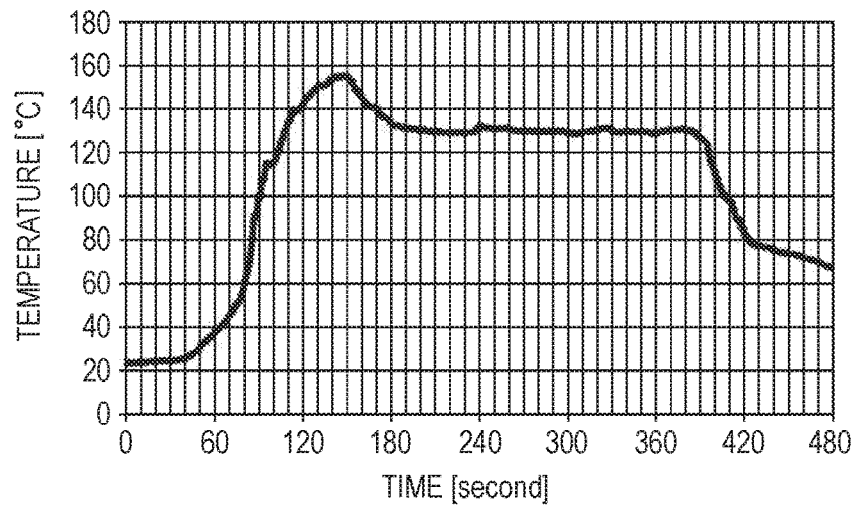
FIG. 15 is a graph illustrating the heating temperature profile observed in the exemplar experiment conducted for the embodiment shown in FIGS. 14A, 14B and 14C.

Then, a solder bonding operation was conducted by heating the solder to 139° C., which is the melting point of the solder, according to the heating profile shown in FIG. 15 without preliminarily heating the thermosetting resin-containing solder paste 1300a in order to prevent the contained thermosetting resin from curing before the solder became molten. Thus, the solder bonding operation was completed. At this time, as shown in FIG. 10C illustrating the heating step, after the solder paste was separated from the thermosetting resin in the thermosetting resin-containing solder paste 1300a, the molten solder 1301 spread to the first lands 1101 and the second lands 1202 and the separated thermosetting resin 1400 also spread and was brought into contact with the metal members 1210.

Subsequently, in the resin curing step shown in FIG. 10D, the temperature was lowered to about 130° C., which was not higher than the melting point of the solder, and the thermosetting resin 1400 was heated to cure while the solder joints 1302 were held in the solidified state to reinforce the solder joints 1302 with the reinforcement resin 1401 surrounding the solder joints 1302. Thus, the manufacturing of the printed circuit board 1500 was completed.

In the printed circuit board 1500 obtained by the above-described manufacturing method, the plurality of first lands 1101 of the electronic component 1100 and the corresponding plurality of second lands 1202 of the printed wiring board 1200 were bonded to each other by way of the respective solder joints 1302 and the solder joints 1302 and their peripheries were reinforce by the reinforcement resin 1401 that had been brought into contact with the bottom surface of the electronic component 1100 and the solder resist 1201 to enhance the strength of the solder joints 1302.

(Evaluation of Printed Circuit Board)

The solder joints 1302 of the printed circuit board 1500 that was manufactured in the above-described manner were examined by means of an X-ray transmission observation apparatus to find no bonding failure such as a solder bridge formed by adjacently located solder joints 1302. Additionally, no conduction failure was observed as a result of an electric examination of the solder joints 1302.

As a result of executing the resin curing step at a low temperature of 130° C., which was not higher than the melting point of solder, the thermal deformation of the imaging device mounted on the printed wiring board 1200 as electronic component 1100 was minimized and the optical performance of the CMOS image sensor contained in it was satisfactorily secured.

Thereafter, the electronic component 1100 and the printed wiring board 1200 were ripped away from each other to look into the state of the solder joints 1302 and that of the reinforcement resin 1401. It was found that the first lands 1101 of the electronic component 1100 and the second lands 1202 of the printed wiring board 1200 had respectively securely been bonded to each other by way of the solder joints 1302 as the solder of the solder joints 1302 had spread to the first lands 1101 and the second lands 1202 and there was no evidence to prove that the thermosetting resin 1400 adversely affected the solder boding.

Subsequently, the state of the peeled reinforcement resin 1401 was visually examined to find that the reinforcement resin 1401 cured while it was being held in contact with the metal members 1210. Additionally, the reinforcement resin 1401 was found to have spread by a distance greater than the calculated value of $L_2$. It may be safe to assume that the reinforcement resin 1401 spread by a distance greater than $L_2$ because the small lumps of molten solder 1301 swelled sideways to reduce their heights from the ideal cylindrical shape to in turn reduce the gap separating the electronic component 1100 and the printed wiring board 1200. From the above fact, it was found that $L_2$ is a distance for satisfactorily causing the small lumps of thermosetting resin 1400 and the corresponding metal members to contact each other.

Furthermore, the fact that most of the bonded parts of the solder resist 1201 did not come off from their counterparts of the reinforcement resin 1401 but the solder resists 1201 was peeled away from the printed wiring board 1200 evidenced that the reinforcement resin 1401 was satisfactorily cured and bonded to the solder resist 1201 with strong bonding force.

Subsequently, the solder resist 1201 that had been peeled away from the printed wiring board 1200 and bonded to the reinforcement resin 1401 was scraped off. Then, the hardness of the scraped off reinforcement resin 1401 was measured by means of a Vickers hardness tester. As a result, the reinforcement resin 1401 showed a degree of hardness that was substantially the same as that of the reinforcement resin 1401*a* shown in Table 3 to prove that the reinforcement resin 1401 had satisfactorily been cured.

OTHER EMBODIMENTS

The above-described embodiments and examples are only exemplary ones that show the applicable scope of the present invention. In other words, the present invention is by no means limited to the above-described embodiments and examples, which can appropriately be modified and altered without departing from the gist of the present invention.

INDUSTRIAL APPLICABILITY

Imaging devices and image processing semiconductor devices were employed as exemplar electronic components in the above-described embodiments, although the present invention is also applicable, for instance, to memory ICs (integrated circuits) and power ICs. Furthermore, the present invention is applicable to electronic components other than semiconductor devices, provided they are equipped with LGA external terminals.

Additionally, while a digital camera 600 was described as an exemplar electronic device, the present invention is equally applicable to other electronic devices such as mobile communication devices.

Thus, according to the present invention, as the resin contained in the thermosetting resin-containing solder paste is brought into contact with the solder and the metal members arranged around the solder and the solder joints and the metal members operate as catalyst for accelerating the curing of the thermosetting resin, the curing time of the thermosetting resin can be reduced even when it is heated to relatively low temperature.

Then, therefore, the time during which the electronic component and the printed wiring board are exposed to high temperature is further reduced to prevent possible degradation of the quality of the printed circuit board. Additionally, since the reinforcement resin is cured in a state where possible thermal deformation of the electronic component and that of the printed wiring board are suppressed, the deformation of the printed circuit board, if any, can be minimized. Furthermore, the cost of manufacturing a printed circuit board can be reduced because the curing time of the reinforcement resin can be reduced even when low heating temperature is employed. Thus, the present invention can provide a printed circuit board showing a high bonding reliability at low cost.

Still additionally, since the area of the solder resist is made greater than the area of the metal members in the electronic component-mounting region on the printed wiring board, the area in which the reinforcement resin is bonded to the solder resist that shows high bonding strength is increased. Thus, any possible fall of the bonding reliability can be minimized even when the metal members show low bonding strength relative to the reinforcement resin.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-029822 filed Feb. 21, 2017, and Japanese patent Application No. 2017-029031 filed Feb. 20, 2017 which are hereby incorporated by reference herein in their entirety.

What is claimed is:

1. A printed circuit board comprising:
an electronic component provided with a plurality of first lands on a bottom surface thereof; and
a printed wiring board having a primary surface facing the bottom surface of the electronic component,
wherein the printed wiring board includes:
a solder resist arranged on the primary surface, the solder resist having a plurality of first apertures and at least one second aperture around at least one of the first apertures; and
a plurality of second lands arranged in the plurality of first apertures on the primary surface so as to face the plurality of first lands respectively,
wherein the plurality of first lands and the plurality of second lands are respectively bonded to each other by means of a solder,
wherein at least one metal member is provided in the at least one second aperture,
wherein a cured thermosetting resin surrounds the solder such that the resin is held in contact with the at least one metal member and bonds the bottom surface of the electronic component to the solder resist on the primary surface, and
wherein, in a plan view of the printed circuit board as seen from a side of the electronic component, a total area of the at least one metal member is not greater than a total area of the solder resist in a region of the primary surface corresponding to a projection area of the electronic component.

2. The printed circuit board according to claim 1, wherein the at least one metal member is electrically connected to a ground wiring of the printed wiring board.

3. The printed circuit board according to claim 1, wherein the at least one metal member is a third land arranged on the printed wiring board.

4. The printed circuit board according to claim 3, wherein the metal member is a small lump of second solder arranged on the third land.

5. An electronic device comprising the printed circuit board according to claim 1.

6. The printed circuit board according to claim 3, wherein the third land has a different shape from a second land of the plurality of second lands.

7. The printed circuit board according to claim 6, wherein the third land has an area smaller than the second land.

8. The printed circuit board according to claim 1, wherein the electronic component is a CMOS sensor or a CCD sensor.

9. The printed circuit board according to claim 1, wherein the electronic component is a digital signal processor.

10. The electronic device according to claim 5, wherein the electronic device is a camera.

11. A printed circuit board comprising:
an electronic component provided with a plurality of first lands on a bottom surface thereof; and
a printed wiring board having a primary surface facing the bottom surface of the electronic component
wherein the printed wiring board includes:
a solder resist arranged on the primary surface, the solder resist having a plurality of first apertures; and
a plurality of second lands arranged in the plurality of first apertures on the primary surface so as to face the plurality of first lands respectively,
wherein the plurality of first lands and the plurality of second lands are respectively bonded to each other by means of a solder,
wherein a cured thermosetting resin surrounds the solder and bonds the bottom surface of the electronic component to the solder resist on the primary surface, and
wherein the printed circuit board has a metal member arranged at a position within a distance from a center of each second land of the plurality of second lands so as to be held in contact with the cured thermosetting resin, the distance being defined by $\sqrt{\{(R_1^2+R_1R_2+R_2^2)/3 \cdot (W_s/100)\}}$, where:
$R_1$ is a radius of the second land;
$R_2$ is a radius of the first land bonded to the second land; and
$W_s$ is a volume fraction as represented by vol % of the solder relative to a sum of a volume of the solder and a volume of the cured thermosetting resin.

12. The printed circuit board according to claim 11, wherein the metal member is electrically connected to a ground wiring of the printed wiring board.

13. The printed circuit board according to claim 11, wherein a plurality of metal members are arranged around the each second land.

14. The printed circuit board according to claim 13, wherein the plurality of metal members are arranged so as to surround the each second land.

15. The printed circuit board according to claim 11, wherein the metal member is a third land arranged on the printed wiring board.

16. The printed circuit board according to claim 15, wherein the metal member is a small lump of second solder arranged on the third land.

17. The printed circuit board according to claim 11, wherein the solder resist has at least one second aperture around at least one of the plurality of first apertures, and
wherein the metal member is provided in the least one second aperture.

18. The printed circuit board according to claim 15, wherein the third land has a different shape from a second land of the plurality of second lands.

19. The printed circuit board according to claim 18, wherein the third land has a smaller area than the second land.

20. The printed circuit board according to claim 11, wherein the electronic component is a CMOS image sensor or a CCD image sensor.

21. The printed circuit board according to claim 11, wherein the electronic component is a digital signal processor.

22. An electronic device comprising the printed circuit board according to claim 11.

23. The electronic device according to claim 22, wherein the electronic device is a camera.

* * * * *